US008652760B2

(12) United States Patent
Sugasaki

(10) Patent No.: US 8,652,760 B2
(45) Date of Patent: Feb. 18, 2014

(54) PRINTING PLATE PRECURSOR FOR LASER ENGRAVING, PRINTING PLATE, AND METHOD FOR PRODUCING PRINTING PLATE

(75) Inventor: Atsushi Sugasaki, Shizuoka-ken (JP)

(73) Assignee: FUJIFILM Corporation, Tokyo (JP)

( * ) Notice: Subject to any disclaimer, the term of this patent is extended or adjusted under 35 U.S.C. 154(b) by 283 days.

(21) Appl. No.: 12/748,463

(22) Filed: Mar. 29, 2010

(65) Prior Publication Data

US 2010/0248139 A1 Sep. 30, 2010

(30) Foreign Application Priority Data

Mar. 30, 2009 (JP) ................................ 2009-083303
Mar. 1, 2010 (JP) ................................ 2010-044189

(51) Int. Cl.
*G03F 7/26* (2006.01)
*B41N 1/06* (2006.01)

(52) U.S. Cl.
USPC ........... 430/306; 430/908; 430/909; 430/944; 101/453; 101/463.1

(58) Field of Classification Search
USPC ........... 430/270.1, 281.1, 306, 906, 908, 909, 430/944; 101/453, 463.1
See application file for complete search history.

(56) References Cited

U.S. PATENT DOCUMENTS

| | | | |
|---|---|---|---|
| 4,883,379 A * | 11/1989 | Fukuda et al. | 400/697.1 |
| 5,453,340 A * | 9/1995 | Kawabata et al. | 430/2 |
| 5,688,629 A * | 11/1997 | Gries | 430/254 |
| 5,694,852 A | 12/1997 | Bressler et al. | |
| 5,798,202 A | 8/1998 | Cushner et al. | |
| 6,273,989 B1 * | 8/2001 | Novak et al. | 156/307.3 |
| 6,508,170 B2 * | 1/2003 | Katsuoka et al. | 101/455 |
| 6,689,543 B2 * | 2/2004 | Kresge et al. | 430/320 |
| 6,737,216 B2 * | 5/2004 | Kannurpatti et al. | 430/270.1 |
| 6,875,514 B2 * | 4/2005 | Sormani et al. | 428/423.1 |
| 7,029,825 B2 | 4/2006 | Yokota et al. | |
| 8,192,898 B2 * | 6/2012 | Satou et al. | 430/1 |
| 2004/0102548 A1 * | 5/2004 | Suzuki | 524/88 |
| 2005/0227165 A1 | 10/2005 | Yamada et al. | |
| 2006/0109531 A1 * | 5/2006 | Watanabe et al. | 359/2 |
| 2007/0084369 A1 | 4/2007 | Kodama et al. | |
| 2007/0240613 A1 * | 10/2007 | Seike et al. | 106/287.14 |
| 2008/0057437 A1 * | 3/2008 | Sugasaki | 430/270.1 |
| 2010/0075117 A1 * | 3/2010 | Kawashima et al. | 428/195.1 |
| 2010/0165260 A1 * | 7/2010 | Hiji et al. | 349/89 |

FOREIGN PATENT DOCUMENTS

| | | | |
|---|---|---|---|
| JP | 10-512823 T | | 12/1998 |
| JP | 2846955 B | | 1/1999 |
| JP | 2001-328365 A | | 11/2001 |
| JP | 2002-003665 A | | 1/2002 |
| JP | 2002-244289 A | | 8/2002 |
| JP | 3438404 B | | 8/2003 |
| JP | 2006-062215 | * | 3/2006 |
| WO | 04000571 A1 | | 12/2003 |
| WO | 2008010230 | | 1/2008 |
| WO | WO 2008/123303 | * | 10/2008 |

OTHER PUBLICATIONS

Machine translation of JP 2006-062215, published on Mar. 9, 2006.*
Communication of a Notice of Opposition dated Jun. 15, 2012 in corresponding EP Application.

* cited by examiner

*Primary Examiner* — Anca Eoff
(74) *Attorney, Agent, or Firm* — Solaris Intellectual Property Group, PLLC

(57) ABSTRACT

A printing plate precursor for laser engraving, including a relief forming layer including a cured resin material formed by thermally crosslinking a resin composition including at least (A) non-porous inorganic particles, (B) a binder polymer having a glass transition temperature (Tg) of 20° C. or higher, and (C) a crosslinking agent.

5 Claims, 1 Drawing Sheet

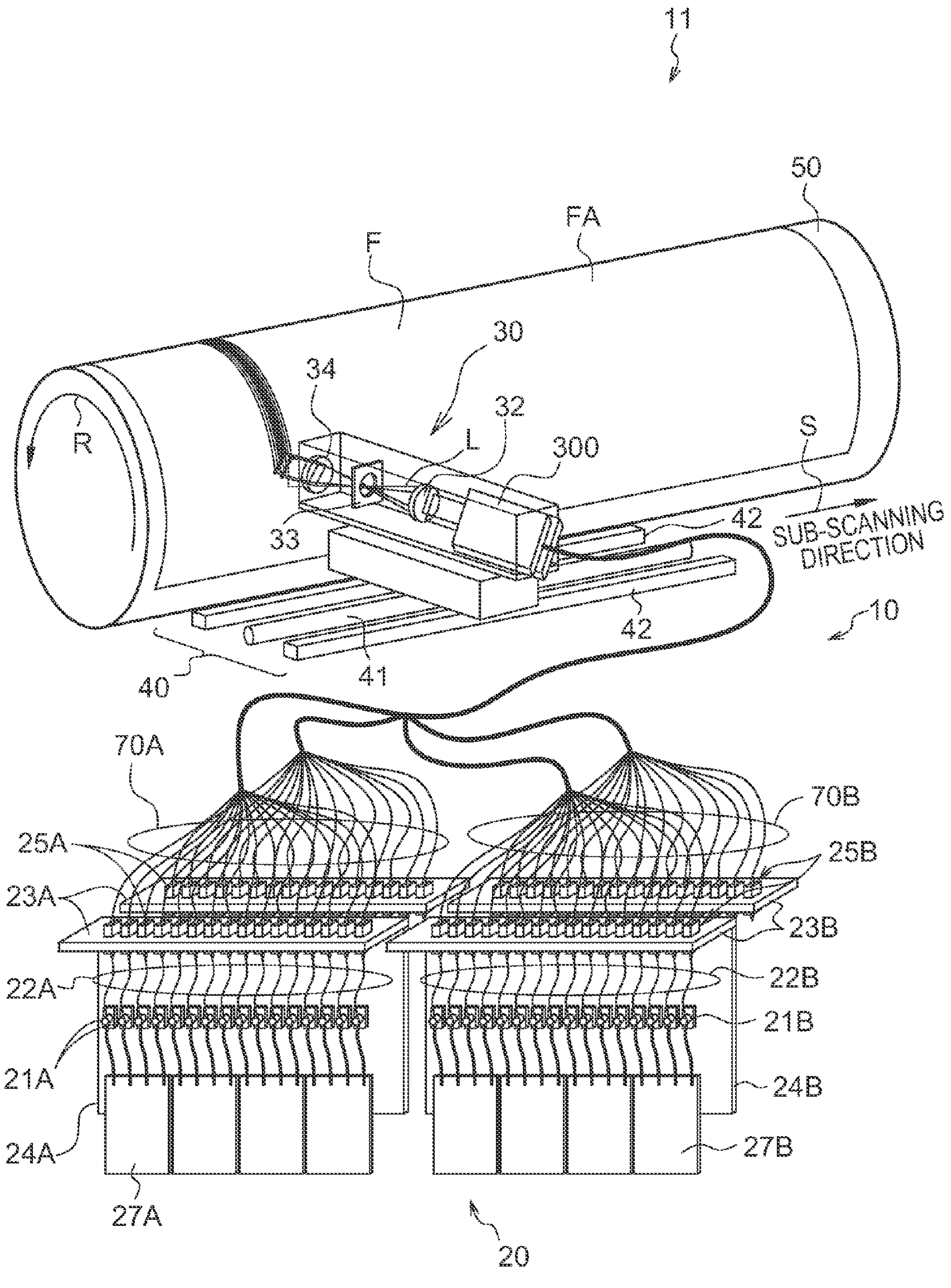
11
50
FA
F
30
34
32
R
L
300
S
33
42
SUB-SCANNING DIRECTION
42
10
40
41
70A
70B
25A
25B
23A
23B
22A
22B
21B
21A
24B
24A
27B
27A
20

PRINTING PLATE PRECURSOR FOR LASER ENGRAVING, PRINTING PLATE, AND METHOD FOR PRODUCING PRINTING PLATE

CROSS-REFERENCE TO RELATED APPLICATION

This application claims priority under 35 USC 119 from Japanese Patent Application No. 2009-083303 filed on Mar. 30, 2009 and Japanese Patent Application No. 2010-044189 filed on Mar. 1, 2010, the disclosures of which are incorporated by reference herein.

BACKGROUND OF THE INVENTION

1. Field of the Invention

The present invention relates to a printing plate precursor for laser engraving, a printing plate, and a method for producing a printing plate.

2. Description of the Related Art

As a method for producing a printing plate by forming concavities and convexities on a photosensitive resin layer laminated on the surface of a support, there is a well known method referred to as "analogue plate-making", which comprises exposing a relief forming layer formed using a photosensitive composition to ultraviolet radiation through an original image film, selectively curing the image areas, and removing uncured portions using a developing solution.

The printing plate is an anastatic printing plate having a relief layer having concavities and convexities, and such a relief layer having concavities and convexities is obtained by patterning a relief forming layer that contains a photosensitive composition containing, as a main component, an elastomeric polymer such as a synthetic rubber, a resin such as a thermoplastic resin, or a mixture of a resin and a plasticizer, and forming concavities and convexities thereon. Among such printing plates, those having a flexible relief layer are referred to as flexo plates in some cases.

When the production of a printing plate is carried out by analogue plate-making, the production process generally requires an original image film utilizing a silver salt material, and thus, time and cost for the production of the original image film are required. Furthermore, since the development of the original image film requires chemical treatment and also requires developing waste disposal, simpler and easier plate production methods such as, for example, a method that does not use an original image film, a method that does not require a development process and the like, are under investigation.

In recent years, methods of carrying out plate-making of a relief forming layer by scanning exposure, without requiring the use of an original image film, have been investigated.

For a technique that does not require an original image film, a printing plate precursor having on a relief forming layer a laser-sensitive mask layer element that is capable of forming an image mask has been proposed. When a method for plate-making using such a precursor is applied, an image mask having a function similar to that of an original image film is formed from the mask layer element by laser irradiation based on image data, and therefore, such a method is referred to as a "mask CTP method". This method does not require an original image film, but the subsequent plate-making process involves the steps of exposing the relief forming layer to ultraviolet radiation through the image mask, and developing and removing uncured portions. Thus, this method still has a room for improvement from the viewpoint that a development process is still required.

For a plate-making method that does not require a development process, a number of so-called "direct engraving CTP methods" have been proposed, in which plate-making is performed by directly engraving the relief forming layer with a laser. The direct engraving CTP method is literally a method of forming concavities and convexities which serve as a relief, by engraving with a laser. This method is advantageous in that, unlike a method of forming a relief using an original image film, the relief shape can be freely controlled. Therefore, in the case of forming an image such as an outline character, the image area can be engraved more deeply than other areas, while in the case of forming a fine halftone dot image, shouldered engraving can be adopted in consideration of the resistance to printing pressure. To date, a number of various plate materials have been proposed as the plate material to be used in the direct engraving CTP method (see, for example, Japanese National Phase Publication (JP-T) No. 10-512823, Japanese Patent Application Laid-Open (JP-A) Nos. 2001-328365 and 2002-3665, and Japanese Patent Nos. 3438404 and 2846955).

In the direct engraving CTP method, when a relief forming layer is directly subjected to plate-making with a laser, there is generated engraving waste that is formed of a low molecular weight polymerizable compound and the like. Since development waste remaining on the plate surface seriously affects the print quality, it is desirable to improve the removability of the generated engraving waste.

For the purpose of improving the removability of engraving waste, for example, International Publication (WO) No. 2004/00571 A1 pamphlet discloses a photosensitive resin composition for a laser-engravable printing plate precursor, which includes inorganic porous particles for adsorbing liquid waste.

Furthermore, JP-A No. 2002-244289 discloses an elastomer composition containing an elastomer, a monomer, a photoinitiator system in which the ultraviolet absorbance decreases as polymerization proceeds, and an additive that absorbs infrared radiation. JP-A No. 2002-244289 describes that an elastomer layer formed using an elastomer composition increases the engraving sensitivity and increases the speed of engraving, so that waste products (liquid waste) generated by engraving can be reduced.

SUMMARY OF THE INVENTION

According to an aspect of the invention, there is provided a printing plate precursor for laser engraving, comprising a relief forming layer comprising a cured resin material formed by thermally crosslinking a resin composition comprising at least (A) non-porous inorganic particles, (B) a binder polymer having a glass transition temperature (Tg) of 20° C. or higher, and (C) a crosslinking agent.

BRIEF DESCRIPTION OF THE DRAWINGS

FIG. 1 is a schematic diagram (perspective view) depicting a plate-making apparatus comprising a fiber-coupled semiconductor laser recording apparatus that is applicable to the invention.

DETAILED DESCRIPTION OF THE INVENTION

Hereinafter, the invention will be described in detail.

<<Printing Plate Precursor for Laser Engraving>>

The printing plate precursor for laser engraving of the invention has a relief forming layer containing a cured resin material formed by thermally crosslinking a resin composition containing at least (A) non-porous inorganic particles, (B) a binder polymer having a glass transition temperature (Tg) of 20° C. or higher, and (C) a crosslinking agent.

First, the cured resin material for constituting the relief forming layer will be described.

The cured resin material according to the invention has high engraving sensitivity when subjected to laser engraving, and has satisfactory removability of engraving waste. Thus, the cured resin material may shorten the time taken during the laser engraving to form a desired engraved product. The cured resin material according to the invention having such characteristics may be widely applied, without particularly limitation, to applications other than the use in a relief forming layer of a printing plate precursor on which laser engraving is performed. For example, the cured resin material may be applied to the formation of the relief forming layer of the printing plate precursor on which an anastatic relief is formed by laser engraving as will be described later, as well as to the formation of other types of materials on which concavities and convexities or apertures are formed, such as various printing plates or various molded products on which an image is formed by laser engraving, for example, intaglio printing plates, screen printing plates, stamps and the like.

As used in the present specification in regard to the descriptions on the printing plate precursor for laser engraving and printing plate, a layer having a flat and smooth surface which serves as an image forming layer that is subjected to laser engraving, is referred to as a relief forming layer, and a layer having concavities and convexities formed on the surface as a result of laser engraving of the relief forming layer, is referred to as a relief layer.

Hereinafter, the resin composition used to form a cured resin material will be described.

The resin composition according to the invention contains (A) non-porous inorganic particles, (B) a binder polymer having a glass transition temperature (Tg) of 20° C. or higher, and (C) a crosslinking agent.

First, these components (A) to (C) will be described.

<(A) Non-Porous Inorganic Particles>

According to the invention, the resin composition contains (A) non-porous inorganic particles.

Here, the term "non-porous" as used herein is defined by the porosity described below, and means that the porosity is 150 or less.

The porosity is the ratio of the specific surface area P to the surface area per unit mass S that is calculated from the number average particle diameter D (unit: μm) of the particles and the density d (unit: g/cm$^3$) of the particles, that is, P/S. When the particle is spherical in shape, the surface area per one particle is $\pi D^2 \times 10^{-12}$ (unit: m$^2$), while the mass of one particle is $(\pi D^3 d/6) \times 10^{-12}$ (unit: g), and thus the surface area per unit mass S=6/(Dd) (unit: m$^2$/g). As the number average particle diameter D, a value measured using a laser diffraction/scattering type particle size distribution measuring apparatus or the like, is used, and even if the particle is not a true sphere, the particle is assumed to be a sphere having a number average particle diameter D.

As the specific surface area P, a value obtained by measuring the nitrogen molecules adsorbed to the particle surface is used. Since the smaller the particle diameter, the larger the specific surface area P, the specific surface area alone is inappropriate as an index representing the characteristics of a porous body. For this reason, the particle diameter is taken into consideration, and the porosity is used as a dimensionless index.

The porosity of the non-porous inorganic particles according to the invention is 150 or less, preferably 100 or less, and more preferably 80 or less, and the porosity of the non-porous inorganic particles may be 1 or more. When the porosity is 150 or less, excellent effects are exerted on the removability of liquid waste.

Here, the specific surface area of the (A) non-porous inorganic particles (measurable by the BET method) is preferably 10 m$^2$/g to 1000 m$^2$/g, more preferably 20 m$^2$/g to 500 m$^2$/g, and particularly preferably 30 m$^2$/g to 300 m$^2$/g, from the viewpoint of the removability of engraving waste. The specific surface area according to the invention is a value obtained from an adsorption isotherm of nitrogen at −196° C. based on the BET formula.

Furthermore, the number average particle diameter D of the (A) non-porous inorganic particles (measurable by the Coulter counter method) is preferably 1 nm to 500,000 nm, more preferably 10 nm to 100,000 nm, and particularly preferably 20 nm to 50,000 nm, from the viewpoint of uniformly dispersing the (A) non-porous inorganic particles in the cured resin material.

The bulk density of the (A) non-porous inorganic particles (measurable by a tap method) is preferably 5 g/l to 300 g/l, more preferably 10 g/l to 150 WI, and particularly preferably 30 g/l to 80 g/l, from the viewpoint of uniformly dispersing the (A) non-porous inorganic particles in the cured resin material.

The shape of the (A) non-porous inorganic particles according to the invention is not particularly limited, and there may be mentioned spherical, polyhedric, flat-shaped, needle-shaped or amorphous particles, particles having projections on the surface, and the like. However, it is preferable that the particle shape be spherical, from the viewpoint of the removability of liquid waste.

The material for the (A) non-porous inorganic particles according to the invention is not particularly limited, but it is preferable that the material contains Si, Ti, Zr or Al as an inorganic element. The material is preferably silica ($SiO_2$), titanium oxide ($TiO_2$) or aluminum oxide ($Al_2O_3$), and particularly preferably silica ($SiO_2$), from the viewpoint of the removability of engraving waste.

In the case of using silica particles as the (A) non-porous inorganic particles, silica particles having an organically modified surface are preferable from the viewpoint of the removability of liquid waste, or the dispersibility in the cured resin material which contains organic materials as main components.

The organic group for modifying the silica surface may be an alkyl group, an aromatic group, or a siloxane group, and preferably an alkyl group or a siloxane group. These groups may have a substituent. Particularly, the alkyl group which may have a substituent is preferably an alkyl group that has been dimethylsilylated, trimethylsilylated, alkylated with a linear alkyl group having 1 to 20 carbon atoms (here, the term "linear" means that the alkyl moiety does not have a substituent), (poly)dimethylsiloxysilylated, or methacryloylated.

Hereinafter, the commercially available products shown below may be mentioned as specific examples of the silica particles used in the invention.

That is, AEROSIL® 50, AEROSIL® 90G, AEROSIL® 130, AEROSIL® 200, AEROSIL® 200V, AEROSIL® 200CF, AEROSIL® 200FAD, AEROSIL® 300, AEROSIL® 300CF, AEROSIL® 380, AEROSIL® R972, AEROSIL® R972V (all manufactured by Nippon Aerosil Co., Ltd.); AEROSIL® R202, AEROSIL® R805, AEROSIL® R812, AEROSIL® R812S, AEROSIL® OX50, AEROSIL® TT600, AEROSIL® MOX80, AEROSIL® MOX170 (all manufactured by Degussa GmbH); SNOWTEX methanol silica sol, SNOWTEX MA-ST-M, SNOWTEX IPA-ST, SNOWTEX EG-ST, SNOWTEX EG-ST-ZL, SNOWTEX NPC-ST, SNOWTEX DMAC-ST, SNOWTEX MEK-ST, SNOWTEX MBA-ST, SNOWTEX MIBA-ST, SNOWTEX ST-20, SNOWTEX ST-30, SNOWTEX ST-40, SNOWTEX ST-C, SNOWTEX ST-N, SNOWTEX STO, SNOWTEX ST-S, SNOWTEX ST-50, SNOWTEX ST-20L, SNOWTEX ST-OL, SNOWTEX ST-XS, SNOWTEX ST-XL, SNOWTEX ST-YL, SNOWTEX ST-ZL, SNOWTEX QAS-40, SNOWTEX LSS-35, SNOWTEX LSS-45, SNOWTEX ST-UP, SNOWTEX ST-OUP, SNOWTEX ST-AK (all manufactured by Nissan Chemical Industries, Ltd.); SUNSPHERE NP-30, SUNSPHERE NP-100, SUNSPHERE NP-200, SUNSPHERE H-121-ET, SUNSPHERE H-51-ET, SUNSPHERE H-52-ET (all manufactured by AGC Si-Tech Co., Ltd.); and the like may be mentioned.

Specific examples of materials other than silica include inorganic fillers such as calcium oxide, aluminum oxide, aluminum octylate, titanium oxide and zirconium silicate; and the like.

The (A) non-porous inorganic particles may be used alone, or may be used in combination of two or more kinds.

The content of the (A) non-porous inorganic particles in the resin composition according to the invention is preferably 0.1% to 60% by mass, more preferably 0.5% to 30% by mass, and even more preferably 1% to 10% by mass, relative to the total weight of the resin composition (100% by mass).

When the content of the (A) non-porous inorganic particles falls in the range mentioned above, the balance between the flexibility required in flexographic printing plates and the film hardness may be satisfactorily maintained.

<(B) Binder Polymer Having Glass Transition Temperature (Tg) of 20° C. or Higher>

The resin composition according to the invention contains (B) a binder polymer having a glass transition temperature (Tg) of 20° C. or higher.

When such a polymer having a glass transition temperature (Tg) of 20° C. or higher is used as the binder polymer, the engraving sensitivity may be increased. Hereinafter, a binder polymer having such a glass transition temperature will be appropriately referred to as "specific binder."

The glass transition temperature (Tg) in the invention is measured by a differential scanning calorimeter (DSC). Specifically, 10 mg of a sample is put in a measuring pan, heated from 30° C. to 250° C. at a rate of 10° C./min (1st-run) under nitrogen atmosphere, cooled to 0° C. at a rate of 10° C./min, and heated again from 0° C. to 250° C. at a rate of 10° C./min (2nd-run). In the 2nd-run, the temperature at which the base line begins to shift from the low temperature side is the glass transition temperature (Tg).

An elastomer in general is academically defined as a polymer having a glass transition temperature lower than or equal to ordinary temperature (see Encyclopedia of Science, $2^{nd}$ Edition, edited by the Foundation for Advancement of International Science, published by Maruzen Corp., p. 154). Therefore, the (B) specific binder is different from such an elastomer, and refers to a polymer having a glass transition temperature exceeding the ordinary temperature. The upper limit of the glass transition temperature of the (B) specific binder is not limited, but the upper limit is preferably 200° C. or lower from the viewpoint of handlability, and is more preferably 36° C. or higher and 120° C. or lower.

The (B) specific binder is in a glassy state at ordinary temperature, and therefore, the thermal molecular motion thereof is fairly restrained, as compared with a binder in a rubbery state. During the process of laser engraving, the heat supplied by the infrared laser at the time of laser irradiation as well as the heat generated by the function of (E) a photothermal converting agent that is used in combination as desired, are transferred to the binder polymer present in the surroundings, and this binder polymer undergoes thermal decomposition and dissipation. As a result, engraving is performed, and concavities are formed.

According to a preferable embodiment of the invention, it is considered that when (E) a photothermal converting agent is present while the thermal molecular motion of a non-elastomer is restrained, the heat transfer to the (B) specific binder and thermal decomposition of the specific binder occur more effectively. Thus, it is considered that the engraving sensitivity is further increased by such effects.

According to the invention, the (B) specific binder is preferably at least one polymer selected from the group consisting of (1) an acrylic resin, (2) an epoxy resin, (3) a polyvinyl acetal, (4) a polyester, and (5) a polyurethane, from the viewpoint of film strength. Among these polymers, the specific binder is more preferably a polymer having hydroxyl groups in the molecule, from the viewpoint of increasing the reactivity when the (C) crosslinking agent is a silane coupling agent.

These polymers will be described in the following.

(1) Acrylic Resin

The acrylic resin that may be used as the (B) specific binder according to the invention, may be an acrylic resin obtainable using a known acrylic monomer. Among these, an acrylic resin having hydroxyl groups in the molecule is preferred.

Examples of the acrylic monomer used in the synthesis of the acrylic resin include (meth)acrylic acid esters, crotonic acid esters, and (meth)acrylamides. When an acrylic resin having hydroxyl groups is to be synthesized, (meth)acrylic acid esters, crotonic acid esters and (meth)acrylamides having a hydroxyl group in the molecule may be used. Specific examples of such an acrylic monomer having a hydroxyl group include 2-hydroxyethyl(meth)acrylate, 2-hydroxypropyl(meth)acrylate, 4-hydroxybutyl(meth)acrylate, and the like.

The acrylic resin may also be synthesized from an acrylic monomer other than the acrylic monomer having a hydroxyl group. Specific examples of the acrylic monomer other than the acrylic monomer having a hydroxyl group include, as (meth)acrylic acid esters, methyl(meth)acrylate, ethyl(meth)acrylate, n-propyl(meth)acrylate, isopropyl(meth)acrylate, n-butyl(meth)acrylate, isobutyl(meth)acrylate, tert-butyl(meth)acrylate, n-hexyl(meth)acrylate, 2-ethylhexyl(meth)acrylate, acetoxyethyl(meth)acrylate, phenyl(meth)acrylate, 2-methoxyethyl(meth)acrylate, 2-ethoxyethyl(meth)acrylate, 2-(2-methoxyethoxy)ethyl(meth)acrylate, cyclohexyl(meth)acrylate, benzyl(meth)acrylate, diethylene glycol monomethyl ether(meth)acrylate, diethylene glycol monoethyl ether(meth)acrylate, diethylene glycol monphenyl ether(meth)acrylate, triethylene glycol monomethyl ether(meth)acrylate, triethylene glycol monoethyl ether(meth)acrylate, dipropylene glycol monomethyl ether(meth)acrylate, polyethylene glycol monomethyl ether(meth)acrylate, polypropylene glycol monomethyl ether(meth)acrylate, monomethyl ether(meth)acrylate of a copolymer of ethylene glycol and propylene glycol, N,N-dimethylaminoethyl(meth)acrylate, N,N-diethylaminoethyl(meth)acrylate, N,N-dimethylaminopropyl(meth)acrylate, and the like.

Furthermore, a modified acrylic resin including an acrylic monomer having a urethane group or a urea group, may also be preferably used.

Among these, an alkyl(meth)acrylate such as lauryl(meth)acrylate, or a (meth)acrylate having an aliphatic cyclic structure, such as t-butylcyclohexyl methacrylate, is particularly preferable from the viewpoint of the resistance to aqueous inks.

The acrylic monomers mentioned above may also be copolymerized with the acrylic monomer having a hydroxyl group.

The weight average molecular weight of such an acrylic resin is preferably 5,000 to 300,000, more preferably 10,000 to 200,000, and even more preferably 20,000 to 100,000, from the viewpoint of solubility in coating solvents (the time required for dissolution).

(2) Epoxy Resin

Using an epoxy resin as the (B) specific binder is also one of preferable embodiments. Among these, an epoxy resin having a hydroxyl group in a side chain is preferred. A preferable specific example is an epoxy resin obtainable by polymerizing an adduct of bisphenol A and epichlorohydrin as a raw material monomer.

Such an epoxy resin preferably has a weight average molecular weight of 800 to 200,000, and a number average molecular weight of 400 to 60,000.

(3) Polyvinyl Acetal

In the present specification, hereinafter, a polyvinyl acetal and a derivative thereof are referred to simply as a polyvinyl acetal. That is, the term "polyvinyl acetal" in the specification encompasses a polyvinyl acetal and a derivative thereof, and generally indicates a compound obtainable by subjecting a polyvinyl alcohol (obtained by saponifying polyvinyl acetate) to cyclic acetalization.

The acetal content (the molar percentage of vinyl alcohol units that are acetalized, relative to the total number of moles of the raw material vinyl acetate monomer taken as 100% by mole) in the polyvinyl acetal is preferably 30% to 90% by mole, more preferably 50% to 85% by mole, and particularly preferably 55% to 78% by mole.

The content of the vinyl alcohol unit in the polyvinyl acetal is preferably 10% to 70% by mole, more preferably 15% to 50% by mole, and particularly preferably 22% to 45% by mole, relative to the total number of moles of the raw material vinyl acetate monomer.

The polyvinyl acetal may also have a vinyl acetate unit as another component, and the content of the vinyl acetate unit is preferably 0.01% to 20% by mole, and more preferably 0.1% to 10% by mole. The polyvinyl acetal may further have another copolymerization unit.

The polyvinyl acetal may be a polyvinyl butyral, a polyvinyl propyral, a polyvinyl ethyral, a polyvinyl methyral, or the like, and among these, a polyvinyl butyral (hereinafter, referred to as PVB) is preferred. In the present specification, the term "polyvinyl butyral" encompasses a polyvinyl butyral and a derivative thereof, and the same applies to other polyvinyl acetals The weight average molecular weight of the polyvinyl acetal is preferably 5,000 to 800,000, and more preferably 8,000 to 500,000, from the viewpoint of maintaining balance between engraving sensitivity and film formability. The molecular weight is particularly preferably 50,000 to 300,000, from the viewpoint of increasing the removability of engraving waste.

A polyvinyl butyral will be described in the following as a particularly preferable example of the polyvinyl acetal, but the invention is not intended to be limited to this.

A structure of a polyvinyl butyral is as shown below and contains these structural units.

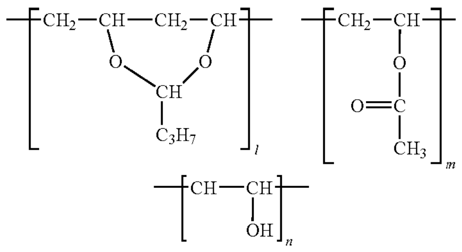

The PVB is commercially available and preferable specific examples thereof include "S-LEC B" series and "S-LEC K (KS)" series (trade names, manufactured by Sekisui Chemical Co., Ltd.) and "DENKA BUTYRAL" (trade name, manufactured by Denki Kagaku Kogyo Co., Ltd.) from the viewpoint of alcohol solubility (particularly ethanol solubility). More preferably, from the viewpoint of alcohol solubility (particularly ethanol solubility), "S-LEC B" series (trade name, manufactured by Sekisui Chemical Co., Ltd.) and "DENKA BUTYRAL" (trade name, manufactured by Denki Kagaku Kogyo Co., Ltd) are exemplified, and particularly preferably "BL-1" (l=61, m=3, n=36 in the above chemical formula, weight average molecular weight: 19000), "BL-1H" (l=67, m=3, n=30, weight average molecular weight: 20000), "BL-2" (l=61, m=3, n=36, weight average molecular weight: about 27000), "BL-5" (l=75, m=4, n=21, weight average molecular weight: 32000), "BL-S" (l=74, m=4, n=22, weight average molecular weight: 23000), "BM-S" (l=73, m=5, n=22, weight average molecular weight: 53000) and "BH-S" (l=73, m=5, n=22, weight average molecular weight: 66000) among the "S-LEC B" series (trade name, manufactured by Sekisui Chemical Co., Ltd.), and "#3000-1" (l=71, m=1, n=28 in the above chemical formula, weight average molecular weight: 74000), "#3000-2" (l=71, m=1, n=28, weight average molecular weight: 90000), "#3000-4" (l=71, m=1, n=28, weight average molecular weight: 117000), "#4000-2" (l=71, m=1, n=28, weight average molecular weight: 152000), "#6000-C" (l=64, m=1, n=35, weight average molecular weight: 308000), "#6000-EP" (l=56, m=15, n=29, weight average molecular weight: 381000), "#6000-CS" (l=74, m=1, n=25, weight average molecular weight: 322000) and "#6000-AS" (l=73, m=1, n=26, weight average molecular weight: 242000) among DENKA BUTYRAL series (trade name, manufactured by Denki Kagaku Kogyo Co., Ltd.) are exemplified.

In the case of using a resin composition using a PVB, the formation of a relief forming layer is preferably carried out by casting a solution of a PVB dissolved in a solvent, and drying it, in view of the smoothness of the film surface.

(4) Polyester

A polyester may be used as the (B) specific binder according to the invention.

The polyester is preferably at least one polyester selected from the group consisting of a polyester including a hydroxycarboxylic acid unit, and derivatives thereof, polycaprolacton (PCL) and derivatives thereof, poly(butylene succinate) and derivatives thereof.

The "polyester including a hydroxycarboxylic acid unit" as used herein refers to a polyester obtainable by a polymerization reaction using a hydroxycarboxylic acid as one of the raw materials. The "hydroxycarboxylic acid" as used herein refers to a compound having at least one OH group and one COOH group in the molecule. It is preferable that the at least one OH group and one COOH group of the "hydroxycarboxylic acid" are present adjacent to each other, and it is also preferable that the OH group and the COOH group are linked via 6 or less atoms, and more preferably 4 or less atoms.

Specific examples of the polyester are preferably selected from the group consisting of polyhydroxyalkanoates (PHA), lactic acid-based polymers, polyglycolic acid (PGA), polycaprolactone (PCL) and poly(butylene succinate), as well as derivatives or mixtures thereof.

The weight average molecular weight of the polyester is preferably 5,000 to 300,000, more preferably 10,000 to 200,000, and even more preferably 20,000 to 100,000, in view of the solubility in coating solvents (the time required for dissolution).

(5) Polyurethane

A polyurethane may also be used as the (B) specific binder according to the invention.

The polyurethane that may be used as the (B) specific binder in the invention is a polyurethane having, in the main skeleton, a structural unit which is a reaction product of at least one diisocyanate compound and at least one diol compound.

Specific examples of the diisocyanate compound include the following compounds.

That is, aromatic diisocyanate compounds such as 2,4-tolylene diisocyanate, a dimer of 2,4-tolylene diisocyanate, 2,6-tolylene diisocyanate, p-xylene diisocyanate, m-xylene diisocyanate, 4,4'-diphenylmethane diisocyanate, 1,5-naphthylene diisocyanate, and 3,3'-dimethylbiphenyl-4,4'-diisocyanate; aliphatic diisocyanate compounds such as hexamethylene diisocyanate, trimethylhexamethylene diisocyanate, lysine diisocyanate, and dimer acid diisocyanate; alicyclic diisocyanate compounds such as isophorone diisocyanate, 4,4'-methylenebis(cyclohexyl isocyanate), methylcyclohexane-2,4- (or 2,6-)diisocyanate, and 1,3-(isocyanatemethyl) cyclohexane; and diisocyanate compounds which are reaction products of diols and diisocyanates, such as an adduct of one mole of 1,3-butylene glycol and two moles of tolylene diisocyanate, may be mentioned.

Particularly from the viewpoint of thermal decomposability, 4,4'-diphenylmethane diisocyanate and 1,5-naphthylene diisocyanate are preferable.

Specific examples of the diol compound include the following compounds.

That is, 1,4-dihydroxybenzene, 1,8-dihydroxynaphthalene, 4,4'-dihydroxybiphenyl, 2,2'-dihydroxybinaphthyl, bisphenol A, 4,4'-bis(hydroxyphenyl)methane, diethylene glycol triethylene glycol, tetraethylene glycol, polyethylene glycol having a weight average molecular weight of 1000, polypropylene glycol having a weight average molecular weight of 1000, and the like may be mentioned.

Preferable examples of the polyurethane also include the polyurethane resin having a structure in which an aromatic group is directly linked to a urethane bond, as described in JP-A No. 2008-26653.

The weight average molecular weight of the polyurethane as the (B) specific binder is preferably 10,000 or larger, and more preferably in the range of 40,000 to 200,000. Particularly, when a polyurethane having a molecular weight in this range is used, the crosslinked resin product formed by thermal crosslinking has excellent strength.

So far, the (1) acrylic resin, (2) epoxy resin, (3) polyvinyl acetal, (4) polyester and (5) polyurethane, which are suitable as the (B) specific binder, have been described, but among these, the specific binder is preferably at least one polymer selected from the group consisting of the (1) acrylic resin, (2) epoxy resin and (3) polyvinyl acetal, from the viewpoint of the engraving sensitivity.

The (B) specific binder may be used alone, or may be used in combination of two or more kinds.

The total content of the (B) specific binder is preferably 15% to 75% by mass, and more preferably 20% to 65% by mass, relative to the total solid mass of the resin composition.

When the content of the binder polymer is adjusted to 15% by mass or more, the resulting printing plate obtains a printing durability that is sufficient for the use as a printing plate. Also, when the content is adjusted to 75% by mass or less, there is no lack of other components, and even when the printing plate is used as a flexographic printing plate, the printing plate acquires a flexibility that is sufficient for the use as a printing plate.

<(C) Crosslinking Agent>

The resin composition according to the invention contains (C) a crosslinking agent.

Since the resin composition contains this (C) crosslinking agent, the resin composition forms a crosslinked structure through thermal crosslinking, and thus a cured resin material may be obtained.

The (C) crosslinking agent according to the invention is not particularly limited, and any crosslinking agent may be used, as long as the agent is capable of curing the resin composition by macromolecularization through heat-induced chemical reactions.

Particularly, as for the (C) crosslinking agent, a polymerizable compound having an ethylenically unsaturated double bond (hereinafter, also referred to as "polymerizable compound"), a silane coupling agent, a compound having at least two isocyanate groups in the molecule (polyfunctional isocyanate), a compound having two or more dibasic acid anhydride sites in the molecule, and the like are preferably used. These compounds may form a cured resin material by reacting with the (B) specific binder mentioned above, or may form a cured resin material by reacting with each other. The compounds may also form a cured resin material by both of these reactions.

If the (C) crosslinking agent reacts with the (B) specific binder, a silane coupling agent is preferably used as the (C) crosslinking agent. Furthermore, if the molecules of the (C) crosslinking agent reacts with each other, a polymerizable compound is preferably used as the (C) crosslinking agent, and in this embodiment, it is more preferable to use a (D) thermopolymerization initiator in combination. It is also preferable to use a polymerizable compound and a silane coupling agent in combination as the (C) crosslinking agent, and when the cured resin material is applied to the relief layer of a printing plate precursor for laser engraving, this combined use is preferable in view of ink transferability.

[Polymerizable Compound]

The polymerizable compound that is used as the (C) crosslinking agent may be any one selected from compounds having at least one, preferably 2 or more, and more preferably 2 to 6 ethylenically unsaturated double bonds.

Hereinafter, a monofunctional monomer having one ethylenically unsaturated double bond in the molecule and a polyfunctional monomer having two or more ethylenically unsaturated double bonds in the molecule, which are used as the polymerizable compound, will be described.

The ethylenically unsaturated group is not particularly limited, but a (meth)acryloyl group, a vinyl group, an allyl group, and the like are preferably used, and a (meth)acryloyl group is particularly preferably used.

Examples of the monofunctional monomer include polymerizable compounds such as unsaturated carboxylic acids such as acrylic acid, methacrylic acid, itaconic acid, crotonic acid, isocrotonic acid, and maleic acid, and salts thereof, anhydrides having an ethylenically unsaturated group, (meth) acrylates, (meth)acrylamides, acrylonitrile, styrene, various unsaturated polyesters, unsaturated polyethers, unsaturated polyamides, and unsaturated urethanes.

Further, preferable examples of the monofunctional monomer include acrylic acid derivatives such as methyl acrylate, ethyl acrylate, n-butyl acrylate, 2-ethylhexyl acrylate, 2-hydroxyethyl acrylate, butoxyethyl acrylate, carbitol acrylate, cyclohexyl acrylate, benzyl acrylate, N-methylol acrylamide and epoxy acrylate, methacrylic acid derivatives such as methyl methacrylate, N-vinyl compounds such as N-vinylpyrrolidone and N-vinyl caprolactam, and allyl compound derivatives such as allyl glycidyl ether, diallyphthalate and triallyl trimellitate.

Examples of the polyfunctional monomer include ester compounds or amide compounds of a polyhydric alcohol compound or a polyamine compound and an unsaturated carboxylic acid, such as ethylene glycol diacrylate, triethylene glycol diacrylate, propylene glycol diacrylate, triethylene glycol dimethacrylate, 1,6-hexanediol diacrylate, 1,3-butanediol diitaconate, pentaerythritol dicrotonate, sorbitol tetramaleate, methylenebis-methacrylamide, and 1,6-hexamethylenebis-acrylamide. Examples of the polyfunctional monomer further include polyfunctional acrylates and methacrylates such as urethane acrylates described in JP-A No. 51-37193, polyester acrylates described in JP-A No. 48-64183 and JP-B Nos. 49-43191 and 52-30490, and epoxy acrylates obtained by reacting an epoxy resin and (meth)acrylic acid. Furthermore, radical polymerizable or crosslinkable monomers and olygomers commercially available or known in the art may be used which include those described, for example, in Journal of the Adhesion Society of Japan, Vol. 20, No. 7, pp. 300-308 (1984); Sinzo Yamashita, "Crosslinking Agent Handbook", (1981, Taiseisha Ltd.); Kiyoshi Kato, "UV•EB Curing Handbook (raw material edition)" (1985, Koubunshi Kankoukai); RadTech Japan, "Application and Market of UV•EB Curing Technique", p. 79 (1989, CMC Publishing Co., Ltd.); Eiichiro Takiyama, "Polyester Resin Handbook", (1988, The Nikkan Kogyo Shimbun, Ltd.) and the like.

Examples of the monofunctional monomer and polyfunctional monomer include esters of unsaturated carboxylic acids (for example, acrylic acid, methacrylic acid, itaconic acid, crotonic acid, isocrotonic acid, maleic acid, and the like) and polyhydric alcohol compounds, amides of unsaturated carboxylic acids and polyamine compounds, and the like.

In the formation of a cured resin material according to the invention, a polyfunctional monomer is preferably used from the viewpoint that a crosslinked structure is easily formed. The molecular weight of such a polyfunctional monomer is preferably 200 to 2,000.

According to the invention, it is preferable to use a compound having a sulfur atom in the molecule as the polymerizable compound, from the viewpoint of increasing the engraving sensitivity.

As for such a polymerizable compound having a sulfur atom in the molecule, it is preferable to use, in particular, a polymerizable compound having two or more ethylenically unsaturated bonds, and having a carbon-sulfur bond at the site linking two of the ethylenically unsaturated bonds (hereinafter, appropriately referred to as "sulfur-containing polyfunctional monomer").

The functional group containing a carbon-sulfur bond in the sulfur-containing polyfunctional monomer according to the invention may be a functional group containing sulfide, disulfide, sulfoxide, sulfonyl, sulfonamide, thiocarbonyl, thiocarboxylic acid, dithiocarboxylic acid, sulfamic acid, thioamide, thiocarbamate, dithiocarbamate or thiourea.

The linking group containing a carbon-sulfur bond that links two ethylenically unsaturated bonds in the sulfur-containing polyfunctional monomer is preferably at least one unit selected from —C—S—, —C—SS—, —NH(C=S)O—, —NH(C=O)S—, —NH(C=S)S— and —C—$SO_2$—.

The number of sulfur atoms contained in the molecule of the sulfur-containing polyfunctional monomer is not particularly limited as long as it is 1 or larger, and the number of sulfur atoms may be appropriately selected according to the purpose. However, the number of sulfur atoms is preferably 1 to 10, more preferably 1 to 5, and even more preferably 1 to 2, from the viewpoint of balance between the engraving sensitivity and the solubility in coating solvents.

On the other hand, the number of ethylenically unsaturated sites contained in the molecule is not particularly limited as long as the number is 2 or larger, and may be appropriately selected according to the purpose. However, the number of ethylenically unsaturated sites is preferably 2 to 10, more preferably 2 to 6, and even more preferably 2 to 4, from the viewpoint of flexibility of the crosslinked film.

The molecular weight of the sulfur-containing polyfunctional monomer according to the invention is preferably 120 to 3,000, and more preferably 120 to 1,500, from the viewpoint of the flexibility of the film to be formed.

The sulfur-containing polyfunctional monomer according to the invention may be used alone, but may also be used as a mixture with a polyfunctional polymerizable compound or monofunctional polymerizable compound, which does not have a sulfur atom in the molecule.

According to a preferable embodiment, the sulfur-containing polyfunctional monomer is used alone, or as a mixture of a sulfur-containing polyfunctional monomer and a monofunctional ethylenic monomer, from the viewpoint of the engraving-sensitivity. According to a more preferable embodiment, the sulfur-containing polyfunctional monomer is used as a mixture with a monofunctional ethylenic monomer.

Concerning the resin composition according to the invention, the film properties such as, for example, brittleness and flexibility, may be regulated by using polymerizable compounds including the sulfur-containing polyfunctional monomer.

The total content of the polymerizable compounds including the sulfur-containing polyfunctional monomer in the resin composition is preferably in the range of 10% to 60% by mass, and more preferably 15% to 45% by mass, based on the non-volatile components, from the viewpoint of the flexibility or brittleness of the crosslinked film.

When the sulfur-containing polyfunctional monomer and another polymerizable compound are used in combination, the amount of the sulfur-containing polyfunctional monomer in the total amount of polymerizable compounds is preferably 5% by mass or more, and more preferably 10% by mass or more.

When a polymerizable compound is used as the (C) crosslinking agent, it is preferable to use a thermopolymerization initiator in combination.

Particularly, it is preferable to use the polymerizable compound in combination with a thermopolymerization initiator, from the viewpoint of increasing the degree of crosslinking. Increasing the degree of crosslinking may lead to an improvement of the quality of engraved images.

The thermopolymerization initiator will be described again later.

[Silane Coupling Agent]

It is also preferable to use a silane coupling agent as the (C) crosslinking agent of the invention.

According to the invention, a functional group having at least one alkoxy group or halogen group directly bonded to a silicon (Si) atom is called a silane coupling group, and a compound having one or more silane coupling groups in the molecule is referred to as a silane coupling agent. The silane coupling group preferably has two or more alkoxy groups or halogen atoms directly bonded to a Si atom, and particularly preferably has three or more directly bonded alkoxy groups or halogen atoms.

The silane coupling agent according to the invention, as described above, has at least one or more functional groups of an alkoxy group and a halogen atom, as the functional group directly bonded to a Si atom, and it is preferable to have an alkoxy group from the viewpoint of easy handlability of the compound.

Here, the alkoxy group is preferably an alkoxy group having 1 to 30 carbon atoms, more preferably an alkoxy group having 1 to 15 carbon atoms, and particularly preferably an alkoxy group having 1 to 5 carbon atoms, from the viewpoint of the removability of liquid waste and the printing durability.

The halogen atom may be a fluorine (F) atom, a chlorine (Cl) atom, a bromine (Br) atom, or an iodine (I) atom. The halogen atom is preferably a Cl atom or a Br atom, and more preferably a Cl atom, from the viewpoint of the ease of synthesis and stability.

The silane coupling agent according to the invention contains preferably 1 to 10, more preferably 1 to 5, and particularly preferably 2 to 4 silane coupling groups in the molecule from the viewpoint of maintaining good balance between the degree of crosslinking and flexibility of the film.

When 2 or more silane coupling groups are present, it is preferable that the silane couplings groups be linked via a linking group. The linking group may be a divalent or higher-valent organic group which may be substituted with a heteroatom or a hydrocarbon. It is preferable from the viewpoint of having high engraving sensitivity that the linking group contain a heteroatom (N, S or O), and a linking group containing a sulfur (S) atom is particularly preferable.

From this point of view, suitable as the silane coupling agent according to the invention is a compound having two silane coupling groups in the molecule, in which each of the silane coupling groups has a methoxy group or an ethoxy group, preferably a methoxy group, as an alkoxy group, bonded to a Si atom, and these silane coupling groups are linked via an alkylene group containing a heteroatom, particularly preferably a S atom.

More specifically, a compound having a linking group containing a sulfide group is preferable.

As another preferable linking group that links silane coupling groups, a linking group having an oxyalkylene group is exemplified. When the linking group includes an oxyalkylene group, the rinse characteristics of the engraving waste after laser engraving may be improved. The oxyalkylene group is preferably an oxyethylene group, and more preferably a polyoxyethylene chain, in which plural oxyethylene groups are linked. The total number of the oxyethylene groups in the polyoxyethylene chain is preferably 2 to 50, more preferably 3 to 30, and particularly preferably 4 to 15.

Specific examples of the silane coupling agent that is applicable to the invention include, for example, vinyltrichlorosilane, vinyltrimethoxysilane, vinyltriethoxysilane, β-(3,4-epoxycyclohexyl)ethyltrimethoxysilane, γ-glycidoxypropyltrimethoxysilane, γ-glycidoxypropylmethyldiethoxysilane, γ-glycidoxypropyltriethoxysilane, γ-methacryloxypropylmethyldimethoxysilane, γ-methacryloxypropyltrimethoxysilane, methacryloxypropylmethyldiethoxysilane, γ-methacryloxypropyltriethoxysilane, γ-acryloxypropyltrimethoxysilane, N-(β-aminoethyl)-γ-aminopropylmethyldimethoxysilane, N-(β-aminoethyl)-γ-aminopropyltrimethoxysilane, N-(β-aminoethyl)-γ-aminopropyltrimethoxysilane, γ-aminopropyltrimethoxysilane, γ-aminopropyltriethoxysilane, N-phenyl-γ-aminopropyltrimethoxysilane, γ-mercaptopropyltrimethoxysilane, γ-chloropropyltrimethoxysilane, γ-ureidopropyltriethoxysilane, and the like. In addition to the above mentioned silane coupling agents, compounds represented by formulas shown below are preferably exemplified. However, the invention is not restricted to these compounds.

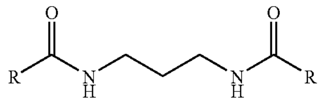
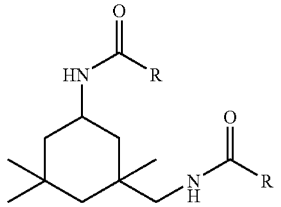
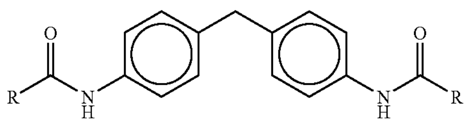
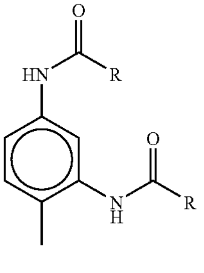
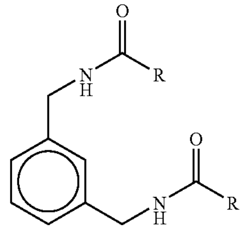
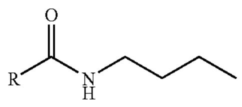

-continued
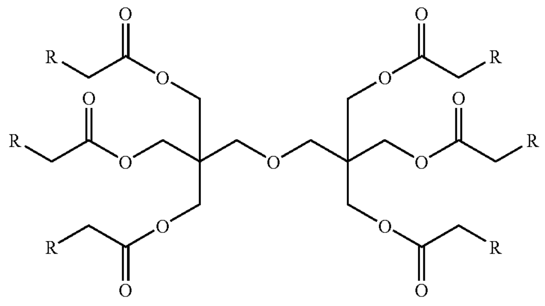
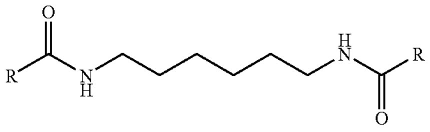
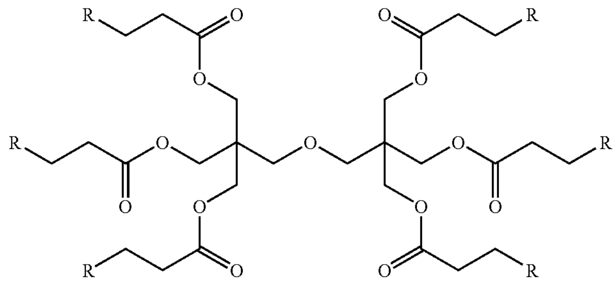
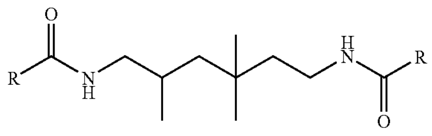
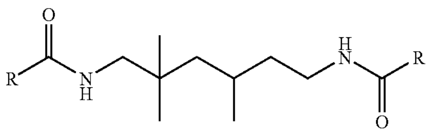
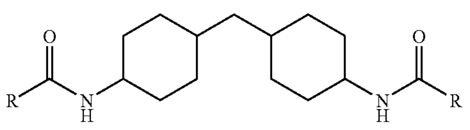
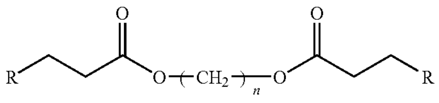
n = 2~20
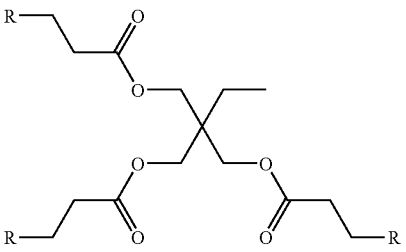
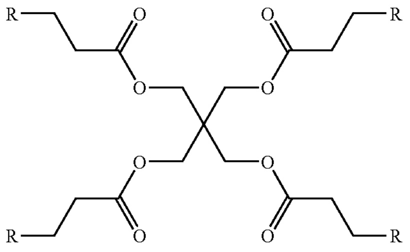
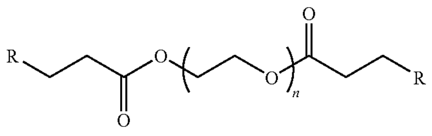
n = 1~50
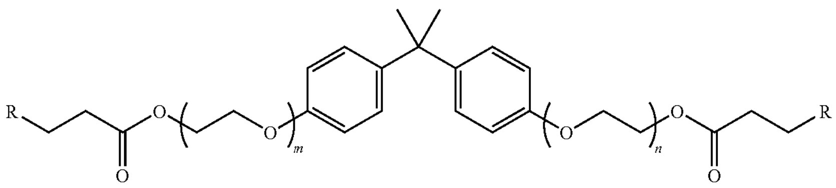
m + n = 2~50
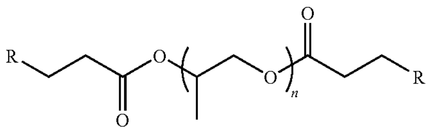
n = 1~50

-continued

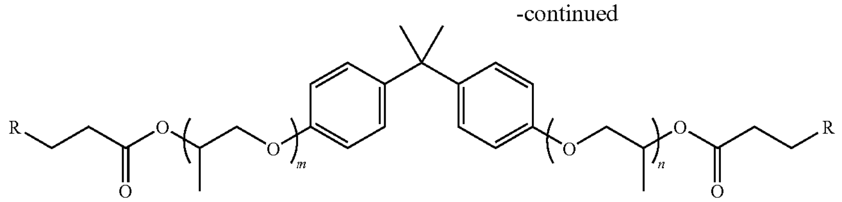

m + n = 2~50

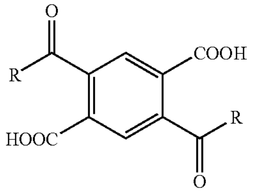

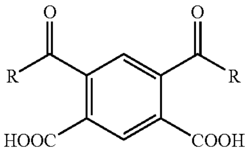

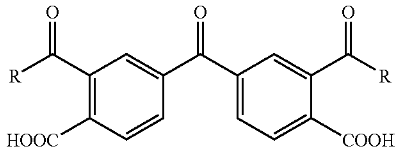

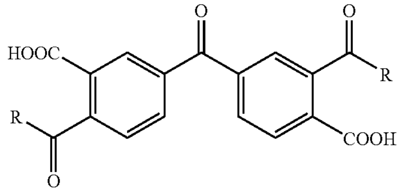

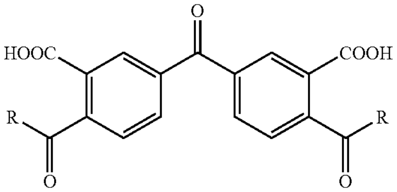

R—S—S—R

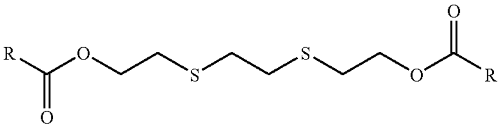

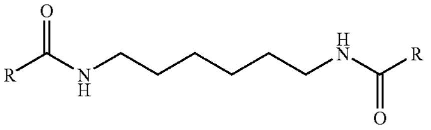

In the above respective formulas, R represents a partial structure selected from structures shown below. When plural Rs and $R^1$s are present in a molecule, these may be same or different from each other. However, these are preferably same from the viewpoint of synthesis suitability.

R: 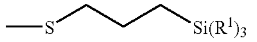 or

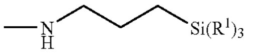 $R^1$: —OMe, —OEt,

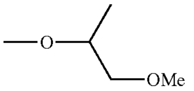 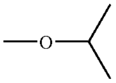 , 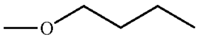 or

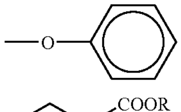 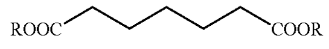

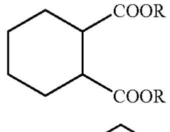 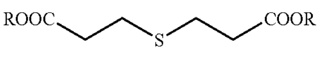

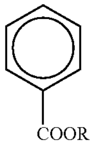 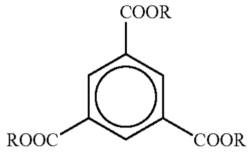

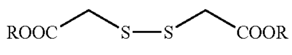 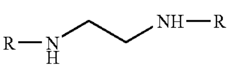

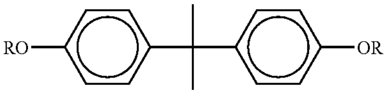

-continued

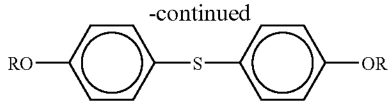

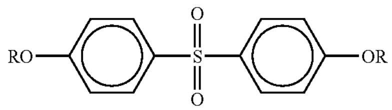

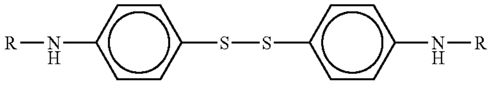

In the above respective formulas, R represents a partial structure shown below. $R^1$ is the same as mentioned above. When plural Rs and $R^1$s are present in a molecule, these may be same or different from each other. However, these are preferably same from the viewpoint of synthesis suitability.

R: 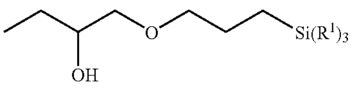

The silane coupling agent may be obtained by appropriately synthesizing. However, commercially available products are preferably used from the viewpoint of cost. Commercially available products such as silane products and silane coupling agents available from Shin-Etsu Chemical Co., Ltd., Dow Corning Toray Silicones Co., Ltd., Momentive Performance Materials, Inc., Chisso Corporation correspond to the silane coupling agent. Accordingly, for a composition of the invention, these commercially available products may be appropriately selected and used in accordance with the object.

As the silane coupling agent in the invention, other than the compounds mentioned above, a partially hydrolyzed condensate obtained from one silane and a partially co-hydrolyzed condensate obtained from two or more kinds of silanes may be used. Hereinafter, these compounds are referred to as "partially (co)hydrolyzed condensate" in some cases.

Specific examples of the partially (co)hydrolyzed condensate include partially (co)hydrolyzed condensates obtained by using, as a precursor, one or more selected from silane compounds including alkoxysilanes such as tetramethoxysilane, tetraethoxysilane, methyltrimethoxysilane, methyltriethoxysilane, methyltriisopropoxysilane, methyltriacetoxysilane, methyltris(methoxyethoxy)silane, methyltris (methoxypropoxy)silane, ethyltrimethoxysilane, propyltrimethoxysilane, butyltrimethoxysilane, hexyltrimethoxysilane, octyltrimethoxysilane, decyltrimethoxysilane, cyclohexyltrimethoxysilane, phenyltrimethoxysilane, phenyltriethoxysilane, tolyltrimethoxysilane, chloromethyltrimethoxysilane, γ-chloropropyltrimethoxysilane, 3,3,3-trifluoropropyltrimethoxysilane, cyanoethyltriethoxysilane, γ-glycidoxypropyltrimethoxysilane, γ-glycidoxypropyltriethoxysilane, epoxycyclohexyl)ethyltrimethoxysilane, γ-aminopropyltrimethoxysilane, γ-aminopropyltriethoxysilane, N-β(aminoethyl)γ-aminopropyltrimethoxysilane, N-phenyl-γ-aminopropyltrimethoxysilane, γ-mercaptopropyltrimethoxysilane, dimethyldimethoxysilane, dimethyldiethoxysilane, diethyldimethoxysilane, methylethyldimethoxysilane, methylpropyldimethoxysilane, diphenyldimethoxysilane, diphenyldiethoxysilane, methylphenyldimethoxysilane, γ-chloropropylmethyldimethoxysilane, 3,3,3-trifluoropropylmethyldimethoxysilane, γ-glycidoxypropylmethyldiethoxysilane, γ-aminopropylmethyldiethoxysilane, N-β(aminoethyl)γ-aminopropylmethyldimethoxysilane, and γ-mercaptopropylmethyldiethoxysilane, and acyloxysilanes such as acetyloxysilane and ethoxalyloxysilane.

Among the silane compounds as a precursor of the partially (co)hydrolyzed condensate, silane compounds having a substituent selected from a methyl group and a phenyl group as a substituent on a silicon atom are preferred from the viewpoint of general versatility, cost and compatibility of a film. Preferable examples of the silane compound as the precursor specifically include methyltrimethoxysilane, methyltriethoxysilane, phenyltrimethoxysilane, phenyltriethoxysilane, dimethyldimethoxysilane, dimethyldiethoxysilane, diphenyldimethoxysilane, and diphenyldiethoxysilane.

In this case, as the partially (co)hydrolyzed condensate, dimer (disiloxane unit obtained by reacting 1 mole of water with 2 moles of silane compound to eliminate 2 moles of alcohol) to 100 mer, preferably dimer to 50 mer and more preferably dimer to 30 mer of the silane compounds such as mentioned above may be suitably used. Furthermore, a partially (co)hydrolyzed condensate obtained from two or more kinds of silane compounds as a raw material may be used.

As such a partially (co)hydrolyzed condensate, commercially available silicon alkoxy oligomers (for example, ones commercially available from Shin-Etsu Chemical Co., Ltd.) or products produced according to an ordinary method in such a manner that hydrolyzing water less than equivalent to a hydrolyzable silane compound is reacted with the hydrolyzable silane compound and thereafter by-products such as alcohol or hydrochloric acid are removed may be used. At the time of production, when, as a raw material hydrolyzable silane compound that is a precursor, for example, alkoxysilanes or acyloxysilanes as mentioned above are used, the alkoxysilanes or acyloxysilanes may be partially hydrolyzed and condensed with an acid such as hydrochloric acid or sulfuric acid, a hydroxide of alkali metal or alkaline earth metal such as sodium hydroxide or potassium hydroxide, or an alkaline organic substance such as triethylamine as a reaction catalyst. When the partially (co)hydrolyzed condensates are directly produced from chlorosilanes, water and alcohol may be reacted with the chlorosilanes using by-product hydrochloric acid as a catalyst.

The silane coupling agent in the resin composition according to the invention may be used alone, or may be used in combination of two or more kinds.

The content of the silane coupling agent contained in the resin composition according to the invention is, in terms of the solid content, preferably in the range of 0.1% to 80% by mass, more preferably 1% to 40% by mass, and most preferably 5% to 30% by mass.

In the resin composition according to the invention, when a polymer having hydroxyl groups is used as the (B) specific binder, the silane coupling group of the silane coupling agent may undergo an alcohol exchange reaction with the hydroxyl group (—OH) in the binder polymer and form a crosslinked structure. As a result, the molecules of the binder polymer are three-dimensionally crosslinked via the silane coupling agent.

In order to accelerate the formation of a crosslinked structure by the silane coupling agent and the polymer having hydroxyl groups as described above, it is preferable to further incorporate an alcohol exchange reaction catalyst into the resin composition of the invention.

The alcohol exchange reaction catalyst may be applied without limitation, as long as it is a reaction catalyst generally used in silane coupling reactions.

Representative alcohol exchange reaction catalysts, namely, (C-1) an acid or basic catalyst, and (C-2) a metal complex catalyst, will be described in order.

(C-1) Acid or Basic Catalyst

As for the catalyst, an acid or a basic compound is directly used, or an acid or a basic compound dissolved in a solvent such as water or an organic solvent is used (hereinafter, respectively referred to as an acidic catalyst and a basic catalyst). The concentration of the compound when dissolved in a solvent is not particularly limited, and the concentration may be appropriately selected in accordance with the characteristics of the acid or basic compound used, the desired content of the catalyst, or the like.

The type of the acidic catalyst or basic catalyst is not particularly limited, but specifically, the acidic catalyst may be a hydrogen halide such as hydrochloric acid; nitric acid, sulfuric acid, sulfurous acid, hydrogen sulfide, perchloric acid, hydrogen peroxide, carbonic acid; a carboxylic acid such as formic acid or acetic acid; a substituted carboxylic acid in which R in the structural formula RCOOH is substituted with another element or substituent; a sulfonic acid such as benzenesulfonic acid; phosphoric acid; or the like, while the basic catalyst may be an ammoniacal base such as ammonia water; an amine such as ethylamine or aniline; or the like. In view of rapidly carrying out the alcohol exchange reaction in the resin composition, the catalyst is preferably methanesulfonic acid, p-toluenesulfonic acid, pyridinium p-toluenesulfonate, phosphoric acid, phosphonic acid or acetic acid, and the catalyst is particularly preferably methanesulfonic acid, p-toluenesulfonic acid or phosphoric acid.

(C-2) Metal Complex Catalyst

The (C-2) metal complex catalyst used as an alcohol exchange reaction catalyst in the invention is preferably a catalyst including a metal element selected from Groups 2A, 3B, 4A and 5A of the Periodic Table, and an oxo or hydroxy oxygen compound selected from a β-diketone (acetylacetone or the like is preferable), a keto ester, a hydroxycarboxylic acid or an ester thereof, an aminoalcohol and an enolic active hydrogen compound.

Among the constituent metal elements, the elements of Group 2A such as Mg, Ca, St and Ba; the elements of Group 3B such as Al and Ga; the elements of Group 4A such as Ti and Zr; and the elements of Group 5A such as V, Nb and Ta are preferable, and they respectively form complexes having excellent catalytic effects. Among these, complexes obtainable from Zr, Al and Ti are excellent and preferable (ethyl ortho-titanate, and the like).

These are all excellent in the stability in aqueous coating liquids, and in the gelation accelerating effect in a sol-gel reaction during drying under heating, and among these, ethylacetoacetate aluminum diisopropylate, aluminum tris(ethylacetoacetate), di(acetylacetonato)titanium complex salts, and zirconium tris(ethylacetoacetate) are particularly preferable.

In the resin composition according to the invention, the alcohol exchange reaction catalyst may be used alone, or may be used in combination of two or more kinds.

The content of the alcohol exchange reaction catalyst in the resin composition according to the invention is preferably 0.01% to 20% by mass, and more preferably 0.1% to 10% by mass, based on the (B) specific binder having hydroxyl groups.

[Polyfunctional Isocyanate]

As the (C) crosslinking agent in the invention, a compound having at least two isocyanate groups in the molecule (polyfunctional isocyanate) is also preferably used.

Examples of the polyfunctional isocyanate include m-phenylene diisocyanate, p-phenylene diisocyanate, 2,6-tolylene diisocyanate, 2,4-tolylene diisocyanate, naphthalene-1,4-diisocyanate, diphenylmethane-4,4'-diisocyanate, 3,3'-dimethoxy-biphenyl diisocyanate, 3,3'-dimethyldiphenylmethane-4,4'-diisocyanate, xylylene-1,4-diisocyanate, xylylene-1,3-diisocyanate, 4-chloroxylylene-1,3-diisocyanate, 2-methylxylylene-1,3-diisocyanate, 4,4'-diphenylpropane diisocyanate,
4,4'-diphenylhexafluoropropane diisocyanate, trimethylene diisocyanate, hexamethylene diisocyanate, propylene-1,2-diisocyanate, butylene-1,2-diisocyanate, cyclohexylene-1,2-diisocyanate, cyclohexylene-1,3-diisocyanate, cyclohexylene-1,4-diisocyanate, dicyclohexylmethane-4,4'-diisocyanate, 1,4-bis(isocyanate methyl)cyclohexane, 1,3-bis(isocyanate methyl)cyclohexane, isophorone diisocyanate, and lysine diisocyanate. Other examples include products formed by addition reaction between the bifunctional isocyanate compounds and bifunctional alcohols or phenols such as ethylene glycols or bisphenols.

Yet other examples include polyfunctional isocyanate compounds. Examples of the polyfunctional isocyanate compounds include biuret or isocyanurate trimers composed mainly of the bifunctional isocyanate compounds; polyfunctional adducts of polyols such as trimethylolpropane and the bifunctional isocyanate compounds; formalin condensates of benzene isocyanate; polymers of isocyanate compounds having a polymerizable group such as methacryloyloxyethyl isocyanate; and lysine triisocyanate.

Among them, biuret or isocyanurate trimers composed mainly of xylene diisocyanate and hydrogenated derivatives thereof, hexamethylene diisocyanate, and tolylene diisocyanate and hydrogenated derivatives thereof, and polyfunctional adducts with trimethylolpropane are particularly preferred. These compounds are described in "Polyurethane Jushi Handbook" (edited by Keiji Iwata, The Nikkan Kogyo Shimbun, Ltd. (1987)).

[Compound Having Two or More Dibasic Acid Anhydride Sites in the Molecule]

As the (C) crosslinking agent in the invention, a compound having two or more dibasic acid anhydride sites in the molecule is also preferably used.

The dibasic acid anhydride in the compound having two or more dibasic acid anhydride sites in the molecule is an anhydride formed by dehydration condensation of two carboxylic acids present in the same molecule. The "dibasic acid anhydride site" is a carboxylic acid anhydride structure formed by dehydration condensation of two carboxylic acid groups present in the same molecule.

The compound having two or more dibasic acid anhydride sites in the molecule may be any compound, as long as it has two or more carboxylic acid anhydride structures in the molecule. That is, a compound having two or more carboxylic acid anhydride structures in the molecule may form a good crosslinked structure together with a reactive functional group included in the (B) specific binder.

The number of the carboxylic acid anhydride structures present in the molecule is preferably 2 to 4, more preferably 2 to 3, and further preferably 2, from the viewpoint of the rinse characteristics.

The compound having two carboxylic acid anhydride structures, which is preferably used in the invention, may be a tetrabasic acid dianhydride. Examples of the tetrabasic acid dianhydride include aliphatic or aromatic tetracarboxylic acid dianhydrides such as biphenyl tetracarboxylic acid dianhydride, naphthalene tetracarboxylic acid dianhydride, diphenyl ether tetracarboxylic acid dianhydride, butane tetracarboxylic acid dianhydride, cyclopentane tetracarboxylic acid dianhydride, pyromellitic acid dianhydride, benzophenone tetracarboxylic acid dianhydride, and pyridine tetracarboxylic acid dianhydride, and ethylene glycol bisanhydrotrimellitate. As a compound having three carboxylic acid anhydride structures, mellitic acid trianhydride may be exemplified.

The content of the polyfunctional isocyanate or the compound having two or more dibasic acid anhydride sites in the molecule which is contained in the resin composition of the invention is preferably 1% to 60% by mass, more preferably 5% to 40% by mass, and most preferably 10% to 30% by mass based on the solid content of the resin composition.

<Solvent>

In regard to the solvent used upon preparing the resin composition according to the invention, it is preferable to use mainly an aprotic organic solvent, from the viewpoint of rapidly carrying out the reaction involving thermal crosslinking. More specifically, it is preferable to use the solvent at the ratio of aprotic organic solvent/protic organic solvent=100/0 to 50/50 (mass ratio), more preferably 100/0 to 70/30, and particularly preferably 100/0 to 90/10.

Preferable specific examples of the aprotic organic solvent include acetonitrile, tetrahydrofuran, dioxane, toluene, propylene glycol monomethyl ether acetate, methyl ethyl ketone, acetone, methyl isobutyl ketone, ethyl acetate, butyl acetate, ethyl lactate, N,N-dimethylacetamide, N-methylpyrrolidone, and dimethyl sulfoxide.

Preferable specific examples of the protic organic solvent include methanol, ethanol, 1-propanol, 2-propanol, 1-butanol, 1-methoxy-2-propanol, ethylene glycol, diethylene glycol, and 1,3-propanediol.

The cured resin material according to the invention is formed by thermally crosslinking the resin composition containing the respective components of (A) to (C) as described above.

The heating method used in this thermal crosslinking may be a method of heating the resin composition for a predetermined time in a hot air oven or a far-infrared oven, or a method of contacting the resin composition with a heated roll for a predetermined time.

The heating conditions may vary depending on the constitution of the resin composition, but the heating may be carried out under the conditions of 80° C. to 120° C. for 0.5 hours to 12 hours. Furthermore, the heating may also be carried out by combining plural heating conditions, in order to obtain desired properties such the hardness of the film.

Such a thermal crosslinking system as described above is characterized in that the crosslinking conditions requires higher temperature and a relatively longer time as compared with a photocrosslinking system. Since the reaction requires high temperature and a long time as such, it is considered that the (A) non-porous inorganic particles in the composition easily have thermal motion (migration within the film under heating) in the crosslinking process, and the (A) non-porous inorganic particles are uniformly distributed in the crosslinked material. As a result, it is considered that since the (A) non-porous inorganic particles are uniformly distributed in the crosslinked material, the (A) non-porous inorganic particles are also uniformly included in the liquid waste generated by engraving, and consequently, the adsorbing effect of the liquid waste is increased, thus the removability being improved.

On the other hand, it is considered that if a photocrosslinking system is used, since the reaction occurs at low temperature for a short time, uniform dispersion of the (A) non-porous inorganic particles is difficult to occur, and such an improvement of the removability of liquid waste as described above cannot be expected.

The resin composition according to the invention may contain various compounds in combination, in addition to the components (A) to (C) and the solvent, according to the purpose, as long as these compounds do not impair the effects of the invention.

<(D) Polymerization Initiator>

The resin composition according to the invention preferably contains (D) a polymerization initiator.

Any polymerization initiator that is known to those ordinarily skilled in the art may be used without limitation. The polymerization initiator may be largely divided into photopolymerization initiators and thermopolymerization initiators. In this invention, a thermopolymerization initiator is preferably used, from the viewpoint of increasing the degree of crosslinking.

Hereinafter, a description will be given on radical polymerization initiators, which are preferable polymerization initiators, but the invention is not intended to be limited thereto.

Preferable examples of the radical polymerization initiators according to the invention include (a) an aromatic ketone, (b) an onium salt compound, (c) an organic peroxide, (d) a thio compound, (e) a hexaarylbiimidazole compound, (f) a ketoxime ester compound, (g) a borate compound, (h) an azinium compound, (i) a metallocene compound, (j) an activated ester compound, (k) a compound having a carbon-halogen bond, (l) an azo compound, and the like, but the invention is not intended to be limited to these.

According to the invention, (c) an organic peroxide and (l) an azo compound are more preferable, and (c) an organic peroxide is particularly preferable, from the viewpoint that these compounds improve the engraving sensitivity, and make the shape of relief edge good when applied to a relief forming layer of a printing plate precursor.

Particularly, the compounds shown below are preferable.

(c) Organic Peroxide

Preferable examples of the (c) organic peroxide as the radical polymerization initiator that may be used in the invention include peroxy esters such as 3,3',4,4'-tetra(tertiary butylperoxycarbonyl)benzophenone, 3,3',4,4'-tetra(tertiary amylperoxycarbonyl)benzophenone, 3,3',4,4'-tetra(tertiary hexylperoxycarbonyl)benzophenone, 3,3',4,4'-tetra(tertiary octylperoxycarbonyl)benzophenone, 3,3',4,4'-tetra(cumylperoxycarbonyl)benzophenone, 3,3',4,4'-tetra(p-isopropylcumylperoxycarbonyl)benzophenone, and di-tertiary butyl diperoxyisophthalate.

(l) Azo Compound

Preferable examples of the (l) azo compound as the radical polymerization initiator that may be used in the invention include 2,2'-azobisisobutyronitrile, 2,2'-azobispropionitrile, 1,1'-azobis(cyclohexane-1-carbonitrile), 2,2'-azobis(2-methylbutyronitrile), 2,2'-azobis(2,4-dimethylvaleronitrile), 2,2'-azobis(4-methoxy-2,4-dimethylvaleronitrile), 4,4'-azobis(4-cyanovaleric acid), dimethyl 2,2'-azobisisobutyrate, 2,2'-azobis(2-methylpropionamidoxime), 2,2'-azobis[2-(2-imidazolin-2-yl)propane], 2,2'-azobis{2-methyl-N-[1,1-bis(hydroxymethyl)-2-hydroxyethyl]propionamide}, 2,2'-azobis[2-methyl-N-(2-hydroxyethyl)propionamide], 2,2'-azobis(N-butyl-2-methylpropionamide), 2,2'-azobis(N-cyclohexyl-2-methylpropionamide), 2,2'-azobis[N-(2-propenyl)-2-methylpropionamide], 2,2'-azobis(2,4,4-trimethylpentane), and the like.

Furthermore, as the (a) aromatic ketone, (b) onium salt compound, (d) thio compound, (e) hexaarylbiimidazole, (f) ketoxime ester compound, (g) borate compound, (h) azinium compound, (i) metallocene compound, (j) active ester compound, and (k) compound having a carbon-halogen bond, those compounds listed in paragraphs [0074] to [0118] of JP-A No. 2008-63554 may be preferably used.

The polymerization initiator according to the invention may be used alone, or may be used in combination of two or more kinds.

The polymerization initiator may be added preferably at a proportion of 0.01% to 10% by mass, and more preferably 0.1% to 3% by mass, relative to the total solid content of the resin composition.

<(E) Photothermal Converting Agent>

The resin composition according to the invention preferably contains (C) a photothermal converting agent.

The photothermal converting agent is considered to accelerate thermal decomposition of the cured resin material according to the invention by absorbing laser light and generating heat. Therefore, it is preferable to select a photothermal converting agent that is capable of absorbing a light having the wavelength of the laser used in engraving.

When a laser emitting an infrared radiation having a wavelength of 700 nm to 1300 nm (YAG laser, semiconductor laser, fiber laser, surface emitting laser, or the like) is used as a light source in the laser engraving, it is preferable that the resin composition according to the invention contain a photothermal converting agent capable of absorbing a light having a wavelength of 700 nm to 1300 nm.

As the photothermal converting agent according to the invention, various dyes or pigments may be used.

In regard to the dyes among the photothermal converting agents, commercially available dyes and those known dyes described in the literature such as, for example, "Handbook of Dyes" (edited by the Society of Synthetic Organic Chemistry, Japan, published in 1970) may be used. Specifically, those having the maximum absorption wavelength in the region of 700 nm to 1300 nm may be mentioned, and dyes such as azo dyes, metal complex salt-azo dyes, pyrazolone azo dyes, naphthoquinone dyes, anthraquinone dyes; phthalocyanine dyes, carbonium dyes, diimmonium compounds, quinonimine dyes, methine dyes, cyanine dyes, squarylium colorants, pyrilium salts, and metal thiolate complexes may be mentioned. Particularly, cyanine dyes such as heptamethine cyanine dyes, oxonol dyes such as pentamethine oxonol dyes, and phthalocyanine dyes are preferably used. For example, the dyes described in paragraphs [0124] to [0137] of JP-A No. 2008-63554 may be mentioned.

In regard to the pigments among the photothermal converting agents used in the invention, commercially available pigments and the pigments described in the Color Index (C.I.) Handbook, "Handbook of New Pigments" (edited by Japan Association of Pigment Technology, published in 1977), "New Pigment Application Technology" (published by CMC, Inc., in 1986), and "Printing Ink Technology" (published by CMC, Inc., in 1984) may be utilized.

The types of the pigment include black pigments, yellow pigments, orange pigments, brown pigments, red pigments, violet pigments, blue pigments, green pigments, fluorescent pigments, metal powder pigments, and other polymer-bound pigments. Specific examples of the pigment that may be used include insoluble azo pigments, azo lake pigments, condensed azo pigments, chelate azo pigments, phthalocyanine pigments, anthraquinone pigments, perylene and perinone pigments, thio indigo pigments, quinacridone pigments, dioxazine pigments, isoindolinone pigments, quinophthalone pigments, dye lake pigments, azine pigments, nitroso pigments, nitro pigments, natural pigments, fluorescent pigments, inorganic pigments, carbon black, and the like. A preferable one among these pigments is carbon black.

All kinds of carbon black may be used irrespective of the classification by ASTM as well as the applications (for example, coloration applications, rubber applications, dry cell applications, and the like), as long as the dispersibility or the like in the composition is stable. Examples of the carbon black include furnace black, thermal black, channel black, lamp black, acetylene black, and the like. Black-colorants such as carbon black may be used in the form of color chips or color pastes in which the colorants have been previously dispersed in nitrocellulose, a binder or the like, using a dispersant as necessary, in order to facilitate dispersion. Such chips or pastes may be easily obtained as commercially available products.

According to the invention, use may be made of a carbon black having a relatively small specific surface area and a relatively small DBP absorption, or even a finely divided carbon black having a large specific surface area. Suitable examples of the carbon black include PRINTEX (registered trademark) U, PRINTEX (registered trademark) A, or SPEZIALSCHWARZ (registered trademark) 4 (all manufactured by Degussa GmbH).

As for the carbon black that is applicable to the invention, a conductive carbon black having a specific surface area of at least 150 $m^2/g$ and a DBP number of at least 150 ml/100 g is preferable, from the viewpoint that the engraving sensitivity is increased as the carbon black efficiently transfers the heat generated by photothermal conversion to the polymer and the like in the surroundings.

This specific surface area is preferably at least 250 $m^2/g$, and particularly preferably at least 500 $m^2/g$. The DBP number is preferably at least 200 ml/100 g, and particularly preferably at least 250 ml/100 g. The carbon black may be an acidic carbon black or a basic carbon black. The carbon black is preferably a basic carbon black. A mixture of different carbon blacks may also be used.

Appropriate conductive carbon blacks having a specific surface area reaching up to about 1500 $m^2/g$ and a DBP number reaching up to about 550 ml/100 g are commercially available, for example, under the name of KETJENBLACK (registered trademark) EC300J, KETJENBLACK (registered trademark) EC600J (manufactured by Akzo Nobel BV), PRINTEX (registered trademark) XE (manufactured by Degussa GmbH), BLACK PEARLS (registered trademark) 2000 (manufactured by Cabot Corp.), or KETJENBLACK (manufactured by Lion Corp.).

The content of the photothermal converting agent in the resin composition according to the invention may vary greatly depending on the magnitude of the molecular extinction coefficient inherent to the molecule, but is preferably in the range of 0.01% to 20% by mass, more preferably in the range of 0.05% to 10% by mass, and particularly preferably in the range of 0.1% to 5% by mass, relative to the total mass of solids in the resin composition.

<Other Additives>

The resin composition according to the invention preferably contains a plasticizer. The plasticizer is an agent having an action of softening a film formed from the resin composition for laser engraving, and thus needs to have good compatibility with the binder polymer.

Examples of the plasticizer include dioctyl phthalate, didodecyl phthalate, polyethylene glycol, polypropylene glycol (mono-ol type or diol-type), and the like, and polypropylene glycol (mono-ol type or diol type) is preferably used.

The resin composition according to the invention preferably contains nitrocellulose or a high heat-conductive substance as an additive for increasing the engraving sensitivity. Since nitrocellulose is a self-reactive compound, the compound itself generates heat upon laser engraving, and thus assists the thermal decomposition of the coexisting (B) specific polymer. It is considered that as a result, the engraving sensitivity is increased. A high heat-conductive substance is added for the purpose of assisting heat conduction, and the heat conductive substance may be an organic compound such as an electroconductive polymer. The electroconductive polymer is particularly preferably a conjugated polymer, and specific examples thereof include polyaniline and polythiophene.

It is desirable to add a small amount of thermpolymerization inhibitor, so as to inhibit any unnecessary thermal polymerization of the polymerizable compounds during the production or storage of the resin composition according to the invention.

A colorant such as a dye or a pigment may also be added to the resin composition according to the invention, for the purpose of coloring the cured resin material according to the invention. Then, properties like the visibility of the image areas in the printing plate, or the adaptability to image density analyzer may be increased.

Known additives such as filler may also be added to ameliorate the properties of a cured film of the resin composition for laser engraving.

<Layer Constitution of Printing Plate Precursor for Laser Engraving>

The printing plate precursor for laser engraving of the invention has a relief forming layer containing the cured resin material according to the invention. The relief forming layer is preferably provided on a support.

The printing plate precursor for laser engraving may further have an adhesive layer between the support and the relief forming layer, and a slip coating layer and a protective film on the relief forming layer, as necessary.

<Relief Forming Layer>

The relief forming layer is a layer formed of the cured resin material according to the invention. As such, the printing plate precursor for laser engraving of the invention has a relief forming layer formed of the cured resin material prepared by thermal crosslinking, and thus abrasion of the relief layer at the time of printing may be prevented. Also, a printing plate having a relief layer having a sharp shape after laser engraving is obtained.

The relief forming layer may be formed by thermally crosslinking a resin composition having the above described components for the relief forming layer (coating liquid for relief forming layer) and forming a sheet-shaped or sleeve-shaped cured resin material.

The relief forming layer is usually provided on a support that will be described later, but may also be directly formed, or may be disposed and fixed, on the surface of a member such as a cylinder mounted in an apparatus for plate-making or printing. That is, in a printing plate precursor for laser engraving that has been produced by coating the resin composition according to the invention, and thermally crosslinking the resin composition from the rear surface (this is the surface opposite to the surface subjected to laser engraving, and also includes a cylindrically shaped surface), since the rear surface side of the cured resin composition (relief forming layer) is capable of functioning as a support, the support is not necessarily essential.

<Support>

A support that may be used for printing plate precursors for laser engraving will be described.

The material used in the support for printing plate precursors for laser engraving is not particularly limited, but a material having high dimensional stability is preferably used. For example, metals such as steel, stainless steel and aluminum; plastic resins such as polyester (for example, PET, PBT, PAN) or polyvinyl chloride; synthetic rubbers such as styrene-butadiene rubber; and plastic resins (epoxy resin, phenolic resin and the like) reinforced with glass fiber, may be mentioned. As for the support, a PET (polyethylene terephthalate) film or a steel substrate is preferably used.

The shape of the support is determined by whether the relief forming layer has a sheet shape or a sleeve shape.

<Adhesive Layer>

An adhesive layer may be provided between the relief forming layer and the support, for the purpose of reinforcing the adhesive power between the both layers.

Examples of the material (adhesive) that may be used in the adhesive layer include those described in I. Skeist, ed., “Handbook of Adhesives”, $2^{nd}$ edition (1977).

<Protective Film, Slip Coating Layer>

For the purpose of preventing scratches or depression at the surface of the relief forming layer, a protective film may be provided on the surface of the relief forming layer.

The thickness of the protective film is preferably 25 μM to 500 μM, and more preferably 50 μm to 200 μm. Examples of the protective film that may be used include polyester films such as PET (polyethylene terephthalate), and polyolefin films such as PE (polyethylene) or PP (polypropylene). Furthermore, the surface of the film may be matted. When a protective film is to be provided on the relief forming layer, the protective film should be peelable.

When the protective film is unpeelable, or on the other hand, when it is difficult to adhere the protective film to the relief forming layer, a slip coating layer may be provided between the both layers. It is preferable that the material used in the slip coating layer contain a resin that is soluble or dispersible in water and is less adhesive, such as polyvinyl alcohol, polyvinyl acetate, partially saponified polyvinyl alcohol, hydroxyalkyl cellulose, alkyl cellulose or a polyamide resin, as a main component.

—Method for Producing Printing Plate Precursor for Laser Engraving—

Next, a method for producing the printing plate precursor for laser engraving of the invention will be described.

The formation of a relief forming layer in the printing plate precursor for laser engraving of the invention is not particularly limited, but there may be mentioned, for example, a method of preparing a coating liquid for relief forming layer (containing the resin composition described above), removing the solvent from this coating liquid for relief forming layer, subsequently melt extruding it on a support, and then thermally crosslinking it. Alternatively, a method of flow casting the coating liquid for relief forming layer on a support, drying this in an oven to remove the solvent from the coating liquid, and then thermally crosslinking it, may also be used.

Here, the heating method and heating conditions employed at the time of thermal crosslinking are similar to those employed upon the formation of the cured resin material according to the invention.

Subsequently, a protective film may be laminated on the relief forming layer, if necessary. The lamination may be performed by pressing the protective film and the relief forming layer with a heated calendar roll or the like, or by adhering the protective film on the relief forming layer that has been impregnated with a small amount of a solvent at the surface.

In the case of using a protective film, a method of first laminating a relief forming layer on the protective film, and then laminating a support thereon, may also be employed.

In the case of providing an adhesive layer, this may be dealt with by using a support having an adhesive layer coated thereon. In the case of providing a slip coating layer, this may be dealt with by using a protective film coated with a slip coating layer.

The coating liquid for relief forming layer may be prepared by, for example, dissolving a binder polymer, and a photothermal converting agent and a plasticizer as optional components, in an appropriate solvent, dissolving a polymerizable compound and a polymerization initiator therein, and adding non-porous inorganic particles thereto. Since most of the solvent component needs to be removed at the stage of producing the relief printing plate precursor, it is preferable to use a low molecular weight alcohol that easily vaporizes (for example, methanol, ethanol, n-propanol, isopropanol, or propylene glycol monomethyl ether) or the like as the solvent, and to suppress the total amount of addition of the solvent to be as small as possible by adjusting the temperature or the like.

The thickness of the relief forming layer in the printing plate precursor for laser engraving is preferably 0.05 mm or more and 10 mm or less, more preferably 0.05 mm or more and 7 mm or less, and particularly preferably 0.05 mm or more and 3 mm or less, before and after crosslinking.

<<Printing Plate and Method for Producing the Same>>

The method for producing a printing plate of the invention includes a step of laser engraving the relief forming layer (cured resin material) in the printing plate precursor for laser engraving of the invention, to form a relief layer (hereinafter, referred to as laser engraving step).

The printing plate of the invention having a relief layer on a support may be produced by the method for producing a printing plate of the invention.

If the relief forming layer is insufficiently crosslinked, the crosslinking of the relief forming layer may be accelerated by means of heat or light, before performing the laser engraving.

The method for producing a printing plate of the invention may further include the following step (1) to step (3) as necessary, subsequently to the laser engraving step.

Step (1): A step of rinsing the engraved surface of the relief layer after engraving, with water or a liquid containing water as a main component (rinsing step).

Step (2): A step of drying the engraved relief layer (drying step).

Step (3): A step of applying energy to the relief layer after engraving to further crosslink the relief layer (post-crosslinking step).

The laser engraving step is a step of forming a relief layer by laser engraving the crosslinked relief forming layer in the printing plate precursor for laser engraving of the invention.

Specifically, a relief layer is formed by irradiating the crosslinked relief forming layer with a laser light corresponding to the image that is intended to be formed, to thereby perform engraving. Preferably, there may be mentioned a step of controlling the laser head with a computer based on the digital data of an image that is intended to be formed, and scan irradiating the relief forming layer.

In this laser engraving step, an infrared laser is preferably used. When infrared laser light is irradiated, the molecules in the relief forming layer undergo molecular vibration, and thus heat is generated. When a high output power laser such as a carbon dioxide laser or a YAG laser is used as the infrared laser, a large amount of heat is generated at the laser-irradiated portions, and the molecules in the relief forming layer undergo molecular cleavage or ionization, so that selective removal, that is, engraving, is performed. An advantage of laser engraving is that, because the engraving depth may be arbitrarily set, the structure may be three-dimensionally controlled. For example, the portions for printing a fine halftone dot image may be made such that the relief does not collapse due to printing pressure, by performing shallow engraving or shouldered engraving. The groove portions for printing fine outline characters may be made, by engraving deeply, such that it is difficult for the ink to fill in the grooves and the outline characters are prevented from collapsing.

Among these, when engraving is performed with an infrared laser corresponding to the absorption wavelength of the (E) photothermal converting agent, selective removal of the relief forming layer may be performed with higher sensitivity, and a relief layer having a sharp image may be obtained. The infrared laser used in such a laser engraving step is preferably a carbon dioxide laser or a semiconductor laser, from the viewpoints of productivity, cost and the like. Particularly, a fiber-coupled semiconductor infrared laser is preferably used.

In general, semiconductor lasers have higher laser oscillation efficiency compared to $CO_2$ lasers, and the cost is low and size reduction may be performed. Also, since the laser is small in size, arraying is easily achievable. The beam shape may be controlled by fiber processing. As the semiconductor laser, a laser having a wavelength of 700 nm to 1300 nm may be used, but a laser having a wavelength of preferably 800 nm to 1200 nm, more preferably 860 nm to 1200 nm, and particularly preferably 900 nm to 1100 nm, may be used.

Hereinafter, one embodiment of a plate-making apparatus 11 comprising a fiber-coupled semiconductor laser recording apparatus 10 that may be used in the production of a printing plate using the printing plate precursor for laser engraving of the invention will be described in terms of configuration, with reference to FIG. 1.

The plate-making apparatus 11 comprising the fiber-coupled semiconductor laser recording apparatus 10 that may be used in the invention performs the engraving (recording) of a two-dimensional image on a printing plate precursor F at high speed, by rotating a drum 50 that has the printing plate precursor F for laser engraving (recording medium) of the invention mounted on the outer peripheral surface, in the main scanning direction, and at the same time, scanning an exposure head 30 at a predetermined pitch in a sub-scanning direction that is orthogonal to the main scanning direction, while simultaneously emitting plural laser beams corresponding to the image data of an image to be engraved (recorded) on the printing plate precursor F. Furthermore, in the case of engraving narrow sections or the like (precision graving of fine lines, halftone dots or the like), the printing plate precursor F is subjected to shallow engraving, while in the case of engraving broad sections or the like, the printing plate precursor F is subjected to deep engraving.

As shown in FIG. 1, the plate-making apparatus 11 includes a drum 50 that is equipped with a printing plate precursor F (on which an image is recorded by engraving with a laser beam) and driven to rotate in the direction of arrow R in FIG. 1 so that the printing plate precursor F moves in the main scanning direction, and a laser recording apparatus 10. The laser recording apparatus 10 includes a light source unit 20 that generates plural laser beams; an exposure head 30 that exposes the printing plate precursor F to the plural laser beams generated at the light source unit 20; and an exposure head moving unit 40 that moves the exposure head 30 along the sub-scanning direction.

The light source unit 20 is equipped with semiconductor lasers 21A and 21B, which are each consisted of a broad area semiconductor laser that is individually coupled with an end of optical fibers 22A and 22B, respectively; light source substrates 24A and 24B, which have the semiconductor lasers 21A and 21B disposed on the surface, respectively; adaptor substrates 23A and 23B, which are each mounted vertically on one end of the light source substrates 24A and 24B, respectively, and also provided with a plurality of adapters (in the same number as the number of the semiconductor lasers 21A and 21B) for SC type optical connectors 25A and 25B; and LD driver boards 27A and 27B, which are each mounted horizontally on the other end of the light source substrates 24A and 24B and also provided with an LD driver circuit 26 (not depicted) that drives the semiconductor lasers 21A and 21B in accordance with the image data of an image to be engraved (recorded) on the printing plate precursor F.

The exposure head 30 is equipped with a fiber array unit 300 that collect and emits the laser beams emitted respectively from the plural semiconductor lasers 21A and 21B. In this fiber array unit 300, the laser beams emitted respectively from the semiconductor lasers 21A and 21B, are transmitted through plural optical fibers 70A and 70B that are respectively connected to the SC type optical connectors 25A and 25B, which are connected to the adaptor substrates 23A and 23B, respectively.

As shown in FIG. 1, the exposure head 30 has a collimator lens 32, an aperture member 33 and an imaging lens 34, arranged side by side in this order, from the side of the fiber array unit 300. Here, the aperture member 33 is disposed such that the aperture is at a far-field position as viewed from the side of the fiber array unit 300. Thereby, an equal light intensity limitation effect may be exerted on all of the laser beams emitted from the optical fiber ends of the plural optical fibers 70A and 70B in the fiber array unit 300.

The laser beams form an image in the vicinity of the exposure surface (front surface) FA of the printing plate precursor F by means of an imaging unit that is consisted of the collimator lens 32 and the imaging lens 34.

Since the fiber-coupled semiconductor laser is capable of changing the beam shape, it is preferable in this invention to control the beam diameter of the exposure surface (front surface of the relief forming layer) FA in the range of 10 μm to 80 μm, by restricting the position of imaging (location of imaging) P to the inner side from the exposure surface FA (to the side of the direction of propagation of the laser beams), from the viewpoint of performing the engraving with high efficiency and improving the fine line reproducibility.

The exposure head moving unit 40 is equipped with a ball screw 41 and a pair of rails 42 that are disposed such that the longitudinal direction follows the sub-scanning direction. By operating a sub-scanning motor 43 that drives the ball screw 41 to rotate, a pedestal unit on which the exposure head 30 is installed may be moved in the sub-scanning direction, while being guided by the rails 42. The drum 50 may be rotated in the direction of arrow R in FIG. 1 by operating the main scanning motor (not depicted), and thus main scanning is performed.

Furthermore, upon controlling the shape that is intended to be engraved, the shape of the engraving area may also be modified by changing the amount of energy supplied to the laser, without changing the shape of the fiber-coupled semiconductor laser beam.

Specifically, a method of controlling the shape by changing the output power of the semiconductor laser, and a method of controlling the shape by chaining the duration of laser irradiation are available.

If engraving waste is adhering to the engraved surface, a step (1) of washing away the engraving waste by rinsing the engraved surface with water or a liquid containing water as a main component, may be added. Examples of the rinsing techniques include a method of washing with tap water; a method of jet spraying high pressure water; a method of brush scrubbing the engraved surface mainly in the presence of water, with a brush type washout machine of batch type or conveyor type known as a developing machine for photosensitive resin anastatic plate; and the like. If the slime of the engraving waste cannot be removed, it is also acceptable to use a rinsing solution containing surfactants.

When the step (1) of rinsing the engraved surface is carried out, it is preferable to add a step (2) of drying the engraved relief forming layer to volatilize the rinsing solution.

Furthermore, a step (3) of further crosslinking the relief forming layer may also be added, if necessary. When the additional crosslinking step (3) is carried out, the relief formed by engraving may be made stronger and firmer.

Through the steps as described above, the printing plate of the invention having a relief layer on which a desired image is formed, may be obtained.

The thickness of the relief layer included in the printing plate is preferably 0.05 mm or more and 10 mm or less, more preferably 0.05 mm or more and 7 mm or less, and particularly preferably 0.05 mm or more and 0.3 mm or less, from the viewpoint of satisfying various suitability for flexographic printing, such as abrasion resistance and ink transferability.

The Shore A hardness of the relief layer included in the printing plate is preferably 50° or larger and 90° or smaller.

When the Shore A hardness of the relief layer is 50° or larger, the fine halftone dots formed by engraving do not collapse and break down even under the high printing pressure exerted by an anastatic printing machine, and ordinary printing may be performed. Also, when the Shore A hardness of the relief layer is 90° or smaller, faded printing in solid image areas may be prevented even in flexographic printing where the printing pressure is kiss-touch pressure.

The Shore A hardness as used herein is a value measured by a durometer (spring type rubber hardness meter), which presses an indenter (called a pressing needle or an indenter) on the surface of an object of measurement to cause a deformation, measures the amount of deformation (indent depth), and obtains numerical data.

The printing plate produced by the method of the invention is capable of printing by an anastatic printing machine using an oily ink or a UV ink, and is also capable of printing by a flexographic printing machine using a UV ink.

According to the invention, for example, the following embodiments <1> to <10> may be provided.

<1> A printing plate precursor for laser engraving, comprising a relief forming layer comprising a cured resin material formed by thermally crosslinking a resin composition comprising at least (A) non-porous inorganic particles, (B) a binder polymer having a glass transition temperature (Tg) of 20° C. or higher, and (C) a crosslinking agent.

<2> The printing plate precursor for laser engraving of <1>, wherein the (B) binder polymer having a glass transition temperature (Tg) of 20° C. or higher is at least one polymer selected from the group consisting of an acrylic resin, an epoxy resin, a polyvinyl acetal, a polyester and a polyurethane.

<3> The printing plate precursor for laser engraving of <1> or <2>, wherein the (B) binder polymer having a glass transition temperature (Tg) of 20° C. or higher is a polymer having a hydroxyl group in a side chain.

<4> The printing plate precursor for laser engraving of any one of <1> to <3>, wherein the (B) binder polymer having a glass transition temperature (Tg) of 20° C. or higher is at least one polymer selected from the group consisting of an acrylic resin, an epoxy resin, and a polyvinyl acetal.

<5> The printing plate precursor for laser engraving of any one of <1> to <4>, wherein the (C) crosslinking agent is a silane coupling agent.

<6> The printing plate precursor for laser engraving of any one of <1> to <5>, wherein the (C) crosslinking agent in the resin composition is a polymerizable compound having an ethylenically unsaturated double bond, and the resin composition further comprises (D) a thermopolymerization initiator.

<7> A method for producing a printing plate, comprising laser engraving the relief forming layer in the printing plate precursor for laser engraving of any one of <1> to <6> to form a relief layer.

<8> A printing plate having a relief layer, produced by the method for producing a printing plate of <7>.

<9> The printing plate of <8>, wherein the thickness of the relief layer is from 0.05 mm to 10 mm.

<10> The printing plate of <8> or <9>, wherein the Shore A hardness of the relief layer is from 50° to 90°.

Therefore, according to the invention, there may be provided a printing plate precursor for laser engraving, which enables direct plate making by laser engraving, and is capable of forming a printing plate that has high engraving sensitivity, allows easy removal of engraving waste from the plate surface after plate-making, and has excellent printing durability and ink transferability.

According to the invention, there may also be provided a method for producing a printing plate having excellent printing durability and ink transferability, by using the printing plate precursor for laser engraving, and a printing plate having excellent printing durability and ink transferability, which is obtained by the production method.

EXAMPLES

Hereinafter, the invention will be described in more detail by way of Examples, but the invention is not intended to be limited to these Examples.

In the Examples, unless stated otherwise, the weight average molecular weight (Mw) of a polymer indicates a value measured by a GPC method.

Example 1

1. Preparation of Coating Liquid for Relief Forming Layer (Resin Composition)

A three-necked flask with a stirring blade and a cooling tube was charged with 50 g of "DENKA BUTYRAL #3000-2" (trade name, manufactured by Denki Kagaku Kogyo Kabushiki Kaisha; polyvinyl butyral derivative, Mw=90,000, Tg=about 68° C.) as the (B) specific binder, and 47 g of propylene glycol monomethyl ether acetate as a solvent, and the mixture was heated at 70° C. for 120 minutes while stirring, to thereby dissolve the polymer. Subsequently, the solution was cooled to 40° C., and 15 g of a monomer (M-1) having a structure shown below, as a polymerizable compound (polyfunctional compound) serving as the (C) crosslinking agent, 8 g of BLENMER LMA (trade name, manufactured by Nippon Oil & Fats Co., Ltd.; lauryl methacrylate) as a polymerizable compound (monofunctional compound), and 1.6 g of PERBUTYL Z (trade name, manufactured by Nippon Oil & Fats Co., Ltd.; t-butyl peroxybenzoate) as the (D) polymerization initiator were added to the solution. The mixture was stirred for 30 minutes. Subsequently, 5 g of AEROSIL 50 (trade name, manufactured by Nippon Aerosil Co., Ltd.) was added as the (A) non-porous inorganic particles, and the mixture was stirred for 30 minutes at 40° C. Through this operation, a coating liquid for crosslinkable relief forming layer 1 (resin composition) having fluidity was obtained.

(M-1)

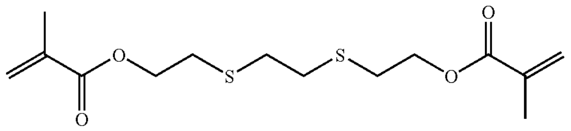

Tg of the specific binder was measured by the above-described method.

Specifically, 10 mg of a sample was put in a measuring pan of a differential scanning calorimeter (DSC, trade name: Q20000, manufactured by TA Instruments Japan), heated from 30° C. to 250° C. at a rate of 10° C./min (1st-run) under nitrogen atmosphere, cooled to 0° C. at a rate of 10° C./min, and heated again from 0° C. to 250° C. at a rate of 10° C./min (2nd-run). In the 2nd-run, the temperature at which the base line began to shift from the low temperature side was the glass transition temperature (Tg).

2. Production of Printing Plate Precursor for Laser Engraving

A spacer (frame) having a predetermined thickness was installed on a PET substrate, and the coating liquid for crosslinkable relief forming layer 1 obtained as described above was gently flow cast to the extent that the coating liquid would not flow out over the spacer (frame). The coating liquid was dried in an oven at 70° C. for 3 hours, and thus a layer having a thickness of approximately 1 mm was formed. This layer was heated for 3 hours at 80° C. and for another 3 hours at 100° C. to thermally crosslink, and thus a relief forming layer was formed.

Thus, a printing plate precursor for laser engraving 1 was obtained.

3. Production of Printing Plate

The relief forming layer after crosslinking (cured resin material) of the printing plate precursor for laser engraving was subjected to engraving with the following two types of lasers.

Engraving by laser irradiation was performed using a high definition $CO_2$ laser marker ML-9100 series (manufactured by Keyence Corp.) as a carbon dioxide laser engraving machine. With this carbon dioxide laser engraving machine, raster engraving was performed on a solid image portion with each of the four sides being 1 cm in length, under the conditions of an output power of 12 W, a head speed of 200 mm/second, and a pitch setting of 2400 DPI.

Engraving by laser irradiation was also performed using the laser recording apparatus shown in FIG. 1 as described above, which was equipped with a fiber-coupled semiconductor laser (FC-LD) SDL-6390 (trade name, manufactured by JDSU Corp.; wavelength: 915 nm) having a maximum output power of 8.0 W, as a semiconductor laser engraving machine. With this semiconductor laser engraving machine, raster engraving was performed on a solid image portion with each of the four sides being 1 cm in length, under the conditions of a laser output power of 7.5 W, a head speed of 409 mm/second, and a pitch setting of 2400 DPI.

The thickness of the relief layer included in the printing plate obtained by the laser engraving as described above was 1.7 mm.

The Shore A hardness of the relief layer was measured by the measurement method described above, and was found to be 75°.

The measurement of the thickness and Shore A hardness of the relief layer was similarly carried out for each of the Examples and Comparative Examples that will be described later. The thickness of the relief layer was all in the range of 0.7 mm to 2.0 mm, and the Shore A hardness was all in the range of 70° to 90°.

Examples 2 to 5

1. Preparation of Coating Liquid for Relief Forming Layer (Resin Composition)

Coating liquids for crosslinkable relief forming layer 2 to 5 (resin compositions) of Examples 2 to 5 were prepared in the same manner as in Example 1, except that the (A) non-porous inorganic particles, (B) specific binder, and (C) crosslinking agent (polymerizable compound (polyfunctional compound)) used in Example 1 were changed to those indicated in the following Table 2.

The physical properties of the (A) non-porous inorganic particles used in the Examples and the Comparative Examples were measured by the following methods, and listed in the following Table 1.

The inorganic particles used in the Examples were non-porous inorganic particles, and each AEROSIL was manufactured by Nippon Aerosil Co., Ltd. SYLOSPHERE C-1504 used in Comparative Example 3 was porous inorganic particles, and manufactured by Fuji Silysia Chemical Ltd.

The specific surface area was determined by applying the BET method (Brunauer et al., J. Am. Chem. Soc., Vol 60, 309 (1938)) to an nitrogen adsorption isotherm of the sample at a liquid nitrogen temperature.

The number average primary particle diameter was determined as a 50% particle diameter by suspending the sample in water by ultrasonic irradiation, and measuring the volume particle size distribution with a Coulter counter multisizer (electrical resistance method).

The apparent specific gravity was measure in accordance with ISO 787/XI.

The bulk density was measured in accordance with ISO 787-11.

The surface area per unit mass was the calculated value as mentioned above.

TABLE 1

| | Specific surface area ($m^2/g$) | Number average particle diameter D (μm) | Apparent specific gravity (g/l) | Bulk density ($g/cm^3$) | Surface area per unit mass ($m^2/g$) | Porosity |
|---|---|---|---|---|---|---|
| AEROSIL 50 | 50 | 5 | 50 | 0.05 | 2.083 | 24 |
| AEROSIL 130 | 130 | 1.6 | 50 | 0.05 | 1.733 | 75 |
| AEROSIL 200CF | 200 | 5 | 30 | 0.03 | 5.000 | 40 |
| AEROSIL RY50 | 50 | 4 | 40 | 0.04 | 1.333 | 38 |
| AEROSIL R974 | 170 | 7 | 50 | 0.05 | 9.917 | 17 |
| AEROSIL RX50 | 50 | 4 | 60 | 0.06 | 2.000 | 25 |
| AEROSIL RA200H | 200 | 5 | 35 | 0.035 | 5.833 | 34 |
| AEROSIL RM50 | 50 | 4 | 20 | 0.02 | 0.667 | 75 |
| AEROXIDE T805 | 45 | 2.1 | 200 | 0.20 | 3.150 | 14 |
| SYLOSPHERE C-1504 | 520 | 4.5 | 5 | 0.005 | 1.950 | 267 |

The details of the (B) specific binder used in the respective Examples are as follows.

Polymer 1: Acrylic resin, a copolymer of 2-hydroxyethyl methacrylate/methyl methacrylate at a mass ratio of 70/30 (Mw=30,000, Tg=about 80° C.)

Polymer 2: Polyurethane, a polyurethane obtained from 4,4-diphenylmethane diisocyanate/diethylene glycol at a molar ratio of 50/50 (Mw=50,000, Tg=about 75° C.)

EPICLON 860-90X: Epoxy resin, manufactured by DIC Corp. (Tg=about 40° C.)

Polylactic acid: Polyester (manufactured by Sigma-Aldrich Company, Tg=about 50° C.)

The monomer (M-2), which is a polymerizable compound (polyfunctional compound) used as the (C) crosslinking agent, is a compound having the following structure.

(M-2)

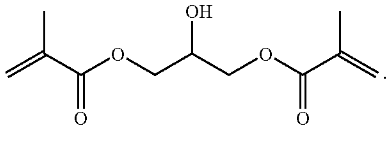

2. Production of Printing Plate Precursor for Laser Engraving

Printing plate precursors for laser engraving 2 to 5 of the Examples were obtained in the same manner as in Example 1, except that the coating liquid for crosslinkable relief forming layer 1 used in Example 1 was changed to the coating liquids for crosslinkable relief forming layer 2 to 5, respectively.

3. Production of Printing Plate

Printing plates 2 to 5 of the Examples were obtained by engraving the thermally crosslinked relief forming layers of the printing plate precursors for laser engraving 2 to 5, respectively, in the same manner as in Example 1 to form relief layers.

The thickness of the relief layer included in such a printing plate was approximately 1 mm.

Example 6

1. Preparation of Coating Liquid for Relief Forming Layer (Resin Composition)

A three-necked flask with a stirring blade and a cooling tube was charged with 50 g of "DENKA BUTYRAL #3000-2" (trade name, manufactured by Denki Kagaku Kogyo Kabushiki Kaisha; polyvinyl butyral derivative, Mw=90,000) as the (B) specific binder, and 47 g of propylene glycol monomethyl ether acetate as a solvent, and the mixture was heated at 70° C. for 120 minutes while stirring, to thereby dissolve the polymer. Subsequently, the solution was cooled to 40° C., and 8 g of BLENMER LMA (trade name, manufactured by Nippon Oil & Fats Co., Ltd.) as a polymerizable compound (monofunctional compound) serving as the (C) crosslinking agent, and 1.6 g of PERBUTYL Z (trade name, manufactured by Nippon Oil & Fats Co., Ltd.) as the (D) polymerization initiator were added to the solution. The mixture was stirred for 30 minutes. Subsequently, 5 g of AEROSIL 200CF (trade name, manufactured by Nippon Aerosil Co., Ltd.) was added as the (A) non-porous inorganic particles, and the mixture was stirred for 30 minutes at 40° C. Subsequently, 15 g of KBE-846 (trade name, manufactured by Shin-Etsu Chemical Co., Ltd.) having the structure shown below as a silane coupling agent serving as the (C) crosslinking agent, and 0.1 g of phosphoric acid as a catalyst were added to the mixture, and the resultant was stirred for 10 minutes at 40° C. Through this operation, a coating liquid for crosslinkable relief forming layer 6 (resin composition) having fluidity was obtained.

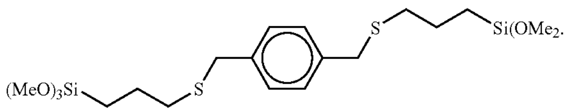

2. Production of Printing Plate Precursor for Laser Engraving

A printing plate precursor for laser engraving 6 of the Example was obtained in the same manner as in Example 1, except that the coating liquid for crosslinkable relief forming layer 1 used in Example 1 was changed to the coating liquid for crosslinkable relief forming layer 6.

3. Production of Printing Plate

A printing plate 6 of the Example was obtained by engraving the thermally crosslinked relief forming layer of the printing plate precursor for laser engraving 6 in the same manner as in Example 1 to form a relief layer.

The thickness of the relief layer included in such a printing plate was approximately 1 mm.

Examples 7 to 14

1. Preparation of Coating Liquid for Relief Forming Layer (Resin Composition)

Coating liquids for crosslinkable relief forming layer 7 to 14 (resin compositions) of Examples 7 to 14 were prepared in the same manner as in Example 6, except that the (A) non-porous inorganic particles used in Example 6 were appropriately changed to the particles indicated in the following Tables 2 and 3.

2. Production of Printing Plate Precursor for Laser Engraving

Printing plate precursors for laser engraving 7 to 14 of the Examples were obtained in the same manner as in Example 1, except that the coating liquid for crosslinkable relief forming layer 1 used in Example 1 was changed to the coating liquids for crosslinkable relief forming layer 7 to 14, respectively.

3. Production of Printing Plate

Printing plates 7 to 14 of the Examples were obtained by engraving the thermally crosslinked relief forming layers of the printing plate precursors for laser engraving 7 to 14, respectively, in the same manner as in Example 1 to form relief layers.

The thickness of the relief layer included in such a printing plate was approximately 1 mm.

Example 15

1. Preparation of Coating Liquid for Relief Forming Layer (Resin Composition)

A three-necked flask with a stirring blade and a cooling tube was charged with 50 g of "DENKA BUTYRAL #3000-2" (trade name, manufactured by Denki Kagaku Kogyo Kabushiki Kaisha; polyvinyl butyral derivative, Mw=90,000) as the (B) specific binder, and 47 g of propylene glycol monomethyl ether acetate as a solvent, and the mixture was heated at 70° C. for 120 minutes while stirring, to thereby dissolve the polymer. Subsequently, the solution was cooled to 40° C., and 15 g of the monomer (M-1) having the structure shown above, as a polymerizable compound (polyfunctional compound) serving as the (C) crosslinking agent, 8 g of BLENMER LMA (trade name, manufactured by Nippon Oil & Fats Co., Ltd.) as a polymerizable compound (monofunctional compound), 1.6 g of PERBUTYL Z (trade name, manufactured by Nippon Oil & Fats Co., Ltd.) as the (D) polymerization initiator, and 1 g of KETJENBLACK EC600JD (carbon black, trade name, manufactured by Lion Corp.) as the (E) photothermal converting agent were added to the solution. The mixture was stirred for 30 minutes. Subsequently, 5 g of AEROSIL RY50 (trade name, manufactured by Nippon Aerosil Co., Ltd.) was added as the (A) non-porous inorganic particles, and the mixture was stirred for 30 minutes at 40° C. Subsequently, 15 g of KBE-846 (trade name, manufactured by Shin-Etsu Chemical Co., Ltd.) having the structure shown above as a silane coupling agent serving as the (C) crosslinking agent, and 0.1 g of phosphoric acid as a catalyst were added to the mixture, and the resultant was stirred for 10 minutes at 40° C. Through this operation, a coating liquid for crosslinkable relief forming layer 15 (resin composition) having fluidity was obtained.

2. Production of Printing Plate Precursor for Laser Engraving

A printing plate precursor for laser engraving 15 of the Example was obtained in the same manner as in Example 1, except that the coating liquid for crosslinkable relief forming layer 1 used in Example 1 was changed to the coating liquid for crosslinkable relief forming layer 15.

3. Production of Printing Plate

A printing plate 15 of the Example was obtained by engraving the thermally crosslinked relief forming layer of the printing plate precursor for laser engraving 15 in the same manner as in Example 1 to form a relief layer.

The thickness of the relief layer included in such a printing plate was approximately 1 mm.

Examples 16 to 21

Example 16

A coating liquid for crosslinkable relief forming layer 16 (resin composition) was obtained by adding 1 g of KETJENBLACK EC600JD (carbon black, trade name, manufactured by Lion Corp.) as the (E) photothermal converting agent to the coating liquid for crosslinkable relief forming layer 1 used in Example 1.

Example 17

A coating liquid for crosslinkable relief forming layer 17 (resin composition) was obtained by adding 1 g of KETJENBLACK EC600JD (carbon black, trade name, manufactured by Lion Corp.) as the (E) photothermal converting agent to the coating liquid for crosslinkable relief forming layer 6 used in Example 6.

Example 18

A coating liquid for crosslinkable relief forming layer 18 (resin composition) was obtained by adding 1 g of KETJEN- BLACK EC600JD (carbon black, trade name, manufactured by Lion Corp.) as the (E) photothermal converting agent to the coating liquid for crosslinkable relief forming layer 15 used in Example 15.

Example 19

A coating liquid for crosslinkable relief forming layer 19 (resin composition) was obtained in the same manner as in Example 6, except that the crosslinking agent used in the coating liquid for crosslinkable relief forming layer 6 was changed to hexamethylene diisocyanate (manufactured by Wako Pure Chemical Industries, Ltd.).

Example 20

A coating liquid for crosslinkable relief forming layer 20 (resin composition) was obtained in the same manner as in Example 6, except that the crosslinking agent used in the coating liquid for crosslinkable relief forming layer 6 was changed to ethylene glycol bisanhydrotrimellitate (trade name: RIKACID TMEG-100, manufactured by New Japan Chemical Co., Ltd.).

Example 21

A coating liquid for crosslinkable relief forming layer 21 (resin composition) was obtained in the same manner as in Example 6, except that the crosslinking agent used in the coating liquid for crosslinkable relief forming layer 6 was changed to M-3 having the following structure.

M-3

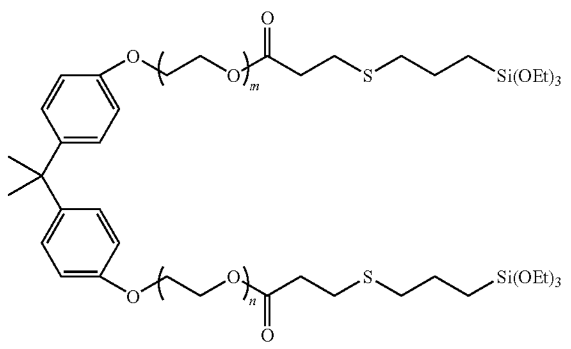

m + n = 10

2. Production of Printing Plate Precursor for Laser Engraving

Printing plate precursors for laser engraving 16 to 21 of the Examples were obtained in the same manner as in Example 1, except that the coating liquid for crosslinkable relief forming layer 1 used in Example 1 was changed to the coating liquids for crosslinkable relief forming layer 16 to 21, respectively.

3. Production of Printing Plate

Printing plates 16 to 21 of the Examples were obtained by engraving the thermally crosslinked relief forming layers of the printing plate precursors for laser engraving 16 to 21, respectively, in the same manner as in Example 1 to form relief layers.

The thickness of the relief layer included in such a printing plate was approximately 1 mm.

Comparative Examples 1 to 3

Comparative Example 1

A coating liquid for crosslinkable relief forming layer B1 was obtained by excluding the (A) non-porous inorganic particles, AEROSIL 200CF, from the coating liquid for crosslinkable relief forming layer 7 used in Example 7.

Comparative Example 2

A coating liquid for crosslinkable relief forming layer B2 was obtained by excluding the (A) non-porous inorganic particles, AEROSIL 200CF, from the coating liquid for crosslinkable relief forming layer 17 used in Example 17.

Comparative Example 3

A coating liquid for crosslinkable relief forming layer B3 was obtained in the same manner as in Example 6, except that the non-porous inorganic particles in the coating liquid for crosslinkable relief forming layer 6 in Example 6 was changed to SYLOSPHERE C-1504.

2. Production of Printing Plate Precursor for Laser Engraving

Printing plate precursors for laser engraving B1 to B3 of the Comparative Examples were obtained in the same manner as in Example 1, except that the coating liquid for crosslinkable relief forming layer 1 used in Example 1 was changed to the coating liquids for crosslinkable relief forming layer B1 to B3, respectively.

3. Production of Printing Plate

Printing plates B1 to B3 of the Comparative Examples were obtained by engraving the thermally crosslinked relief forming layers of the printing plate precursors for laser engraving B1 to B3, respectively, in the same manner as in Example 1 to form relief layers.

The thickness of the relief layer included in such a printing plate was approximately 1 mm.

TABLE 2

| | Coating liquid for relief forming layer (resin composition) | | | Engraving | | | Film elasticity | | |
|---|---|---|---|---|---|---|---|---|---|
| | Inorganic particles | (B) Specific binder | (C) Crosslinking agent | depth with FC-LD (μm) | Engraving depth with $CO_2$ laser (μm) | Removability of liquid waste | (plastic deformation ratio) | Printing durability | Ink transfer ability |
| Ex. 1 | AEROSIL 50 | DENKA BUTYRAL #3000-2 | M-1 | 0 | 345 | B | 8% | 1700 | B |
| Ex. 2 | AEROSIL 130 | Polymer-1 | M-2 | 0 | 330 | B | 7% | 1750 | B |

TABLE 2-continued

| | Coating liquid for relief forming layer (resin composition) | | | Engraving | | | Film elasticity | | |
|---|---|---|---|---|---|---|---|---|---|
| | Inorganic particles | (B) Specific binder | (C) Crosslinking agent | depth with FC-LD (μm) | Engraving depth with $CO_2$ laser (μm) | Removability of liquid waste | (plastic deformation ratio) | Printing durability | Ink transfer ability |
| Ex. 3 | AEROSIL 200CF | EPICLON 860-90X | M-1 | 0 | 340 | B | 9% | 1750 | B |
| Ex. 4 | AEROSIL 50 | Polylactic acid | M-2 | 0 | 330 | B | 8% | 1800 | B |
| Ex. 5 | AEROSIL 50 | Polymer-2 | M-1 | 0 | 344 | B | 9% | 1700 | B |
| Ex. 6 | AEROSIL 200CF | DENKA BUTYRAL #3000-2 | KBE-846 | 0 | 350 | B | 9% | 2000 | A |
| Ex. 7 | AEROSIL 200CF | DENKA BUTYRAL #3000-2 | KBE-846 | 0 | 350 | B | 8% | 1900 | A |
| Ex. 8 | AEROSIL 200CF | DENKA BUTYRAL #3000-2 | KBE-846 | 0 | 345 | B | 9% | 2000 | A |
| Ex. 9 | AEROSIL RY50 | DENKA BUTYRAL #3000-2 | KBE-846 | 0 | 345 | A | 5% | 2000 | A |
| Ex. 10 | AEROSIL R974 | DENKA BUTYRAL #3000-2 | KBE-846 | 0 | 355 | A | 5% | 2000 | A |
| Ex. 11 | AEROSIL RX50 | DENKA BUTYRAL #3000-2 | KBE-846 | 0 | 344 | A | 6% | 2000 | A |
| Ex. 12 | AEROSIL RA200H | DENKA BUTYRAL #3000-2 | KBE-846 | 0 | 350 | A | 5% | 2000 | A |
| Ex. 13 | AEROSIL RM50 | DENKA BUTYRAL #3000-2 | KBE-846 | 0 | 350 | A | 5% | 1900 | A |
| Ex. 14 | AEROXIDE T805 | DENKA BUTYRAL #3000-2 | KBE-846 | 0 | 350 | A | 5% | 100 | A |

TABLE 3

| | Coating liquid for relief forming layer (resin composition) | | | Engraving | Engraving | | Film elasticity | | |
|---|---|---|---|---|---|---|---|---|---|
| | Inorganic particles | (B) Specific binder | (C) Crosslinking agent | depth with FC-LD (μm) | depth with $CO_2$ laser (μm) | Removability of liquid waste | (plastic deformation ratio) | Printing durability | Ink transfer ability |
| Ex. 15 | AEROSIL RY50 | DENKA BUTYRAL #3000-2 | KBE-846 + M-1 | 420 | 340 | A | 6% | 2100 | A |
| Ex. 16 | AEROSIL 50 | DENKA BUTYRAL #3000-2 | M-1 | 420 | 340 | B | 5% | 2000 | B |
| Ex. 17 | AEROSIL 200CF | DENKA BUTYRAL #3000-2 | KBE-846 | 380 | 340 | B | 8% | 2000 | A |
| Ex. 18 | AEROSIL RY50 | DENKA BUTYRAL #3000-2 | KBE-846 + M-1 | 380 | 340 | A | 5% | 2100 | A |
| Ex. 19 | AEROSIL 200CF | DENKA BUTYRAL #3000-2 | Hexamethylene diisocyanate | 0 | 310 | C | 8% | | B |
| Ex. 20 | AEROSIL 200CF | DENKA BUTYRAL #3000-2 | Ethylene glycol bisanhydro trimellitate | 0 | 300 | C | 10% | | B |
| Ex. 21 | AEROSIL 200CF | DENKA BUTYRAL #3000-2 | M-3 | 0 | 355 | A | 5% | | A |
| Comp. Ex. 1 | None | DENKA BUTYRAL #3000-2 | KBE-846 | 0 | 330 | D | 9% | 1500 | B |
| Comp. Ex. 2 | None | DENKA BUTYRAL #3000-2 | KBE-846 | 370 | 320 | D | 27% | 1500 | D |
| Comp. Ex. 3 | SYLOSPHERE C-1504 | DENKA BUTYRAL #3000-2 | KBE-846 | 370 | 320 | D | 10% | | D |

4. Evaluation of Printing Plate

A performance evaluation of the printing plates was carried out on the following items, and the results are presented in Table 2 and Table 3.

(4-1) Engraving Depth

The "engraving depths" of the relief layers obtained by laser engraving the relief forming layers included in the printing plate precursors for laser engraving 1 to 21 and B1 to B3 were measured as follows. Here, the "engraving depth" means the difference between the position (height) of an engraved site and the position (height) of a non-engraved site, when the cross-section of the relief layer was observed. The "engraving depth" in the present Examples was measured by observing the cross-section of a relief layer with an ultra-deep color 3D profile measuring microscope, VK9510 (trade name, manufactured by Keyence Corp.). A larger engraving depth means higher engraving sensitivity. The results are presented in Table 2 and Table 3 for each type of laser used in the engraving.

The engraving depth obtained with the FC-LD in the Examples 1 to 14 and Comparative Example 1 was "0", which implies that the component (photothermal converting agent) that absorbs the light having the wavelength of FC-LD was not contained in the relief forming layer, and engraving was not performed with the FC-LD.

(4-2) Removability of Liquid Waste (Engraving Waste)

A laser engraved plate was immersed in water, and the engraved areas were rubbed 10 times with a toothbrush (trade name: CLINICA TOOTHBRUSH FLAT, manufactured by Lion Corp.). Subsequently, the presence or absence of waste at the surface of the relief layer was checked with an optical microscope. Those plates having no waste were rated as A; those plates having almost no waste were rated as B; those plates having some waste remaining behind were rated as C; and those plates having waste unremoved were rated as D.

(4-3) Film Elasticity (Plastic Deformation Ratio)

The film elasticity of the relief layer obtained by laser engraving was measured with a microhardness meter (trade name: HMV-1, manufactured by Shimadzu Corp.). Indentation was performed for 10 seconds under an indentation load of 300 mN, and then the indentation was released. The plastic deformation ratio before and after the indentation was measured.

(4-4) Printing Durability

An obtained printing plate was mounted on a printing machine (ITM-4 type, manufactured by Iyo Kikai Seisakusho Co., Ltd.), and printing was continuously performed using an aqueous ink AQUA SPZ16 RED (trade name, manufactured by Toyo Ink Manufacturing Co., Ltd.) as an ink without diluting, and using FULL COLOR FORM M70 (trade name, manufactured by Nippon Paper Group, thickness 100 μm) as a printing paper. A highlight from 1 to 10% was checked on the printed matter. The time when unprinted halftone dots occurred was regarded as completion of printing, and the length (meter) of paper that had been printed until the completion of printing was taken as the index. A larger value of this index was evaluated to have excellent printing durability.

(4-5) Ink Transferability

During the evaluation of printing durability, the degree of adherence of ink at the solid image area on a printed matter at paper lengths of 500 m and 1000 m from the initiation of printing were compared by visual inspection.

A printed matter having uniform density without unevenness was rated as B; a printed matter in a particularly good state was rated as A; and a printed matter having density unevenness was rated as D.

As shown in Table 2 and Table 3, it is found that the printing plates of the Examples produced using cured resin materials (relief forming layers) formed by thermally crosslinking resin compositions containing the components (A) to (C) have excellent removability of liquid waste (engraving waste) and high productivity at the time of plate-making, as compared with the printing plates of the Comparative Examples.

It is also found that the printing plates of the Examples are excellent in elasticity (plastic deformation ratio) of the relief layer, ink transferability and printing durability, exhibit excellent printing performance for a long time, and have a large engraving depth, so that the engraving sensitivity is good.

On the other hand, the printing plates of the Comparative Examples were found to be inferior in the removability of liquid waste, regardless of whether the elasticity was good or poor.

All publications, patent applications, and technical standards mentioned in this specification are herein incorporated by reference to the same extent as if each individual publication, patent application, or technical standard was specifically and individually indicated to be incorporated by reference.

What is claimed is:

1. A method for producing a printing plate, comprising providing a printing plate precursor for laser engraving comprising a relief forming layer comprising a cured resin material formed by thermally crosslinking a resin composition comprising at least (A) non-porous inorganic particles, (B) a binder polymer having a glass transition temperature (Tg) of 20° C. or higher, and (C) a crosslinking agent, wherein the (B) binder polymer having a glass transition temperature (Tg) of 20° C. or higher is at least one polymer selected from the group consisting of an epoxy resin, a polyvinyl acetal and a polyester; and wherein the (C) crosslinking agent is selected from the group consisting of a silane coupling agent that includes two or more silane coupling groups linked via a linking group containing a heteroatom, a compound having at least two isocyanate groups in the molecule, and a compound having two or more dibasic acid anhydride sites in the molecule; and laser engraving the relief forming layer in the printing plate precursor for laser engraving.

2. The method of claim 1, wherein the (B) binder polymer having a glass transition temperature (Tg) of 20° C. or higher is a polymer having a hydroxyl group in a side chain.

3. The method of claim 1, wherein the (B) binder polymer having a glass transition temperature (Tg) of 20° C. or higher is at least one polymer selected from the group consisting of an epoxy resin, and a polyvinyl acetal.

4. The method of claim 1, wherein the (C) crosslinking agent is a silane coupling agent that includes two or more silane coupling groups linked via a linking group containing a heteroatom.

5. The method of claim 1, wherein the (B) binder polymer having a glass transition temperature (Tg) of 20° C. or higher comprises the following structural units:

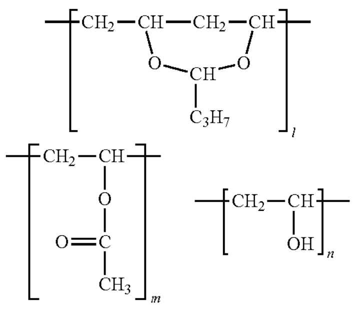

wherein l represents an integer of from 56 to 75, m represents an integer of from 1 to 15, and n represents an integer of from 21 to 36.

* * * * *